US007705695B2

(12) United States Patent
Kushta

(10) Patent No.: US 7,705,695 B2
(45) Date of Patent: Apr. 27, 2010

(54) COMPOSITE VIA STRUCTURES AND FILTERS IN MULTILAYER PRINTED CIRCUIT BOARDS

(75) Inventor: Taras Kushta, Tokyo (JP)

(73) Assignee: NEC Corporation, Tokyo (JP)

( * ) Notice: Subject to any disclaimer, the term of this patent is extended or adjusted under 35 U.S.C. 154(b) by 523 days.

(21) Appl. No.: 11/658,004

(22) PCT Filed: Jul. 19, 2005

(86) PCT No.: PCT/JP2005/013539

§ 371 (c)(1),
(2), (4) Date: Jan. 22, 2007

(87) PCT Pub. No.: WO2006/009274

PCT Pub. Date: Jan. 26, 2006

(65) Prior Publication Data

US 2008/0093112 A1    Apr. 24, 2008

(30) Foreign Application Priority Data

Jul. 23, 2004  (JP) .............................. 2004-215846

(51) Int. Cl.
*H01P 1/20*  (2006.01)

(52) U.S. Cl. ........................................ 333/204; 333/246
(58) Field of Classification Search ................ 333/132, 333/165–168, 175, 176, 202, 204, 206, 243, 333/219, 246, 33; 174/266
See application file for complete search history.

(56) References Cited

U.S. PATENT DOCUMENTS

2005/0030231 A1    2/2005  Nagaishi et al.
2006/0125573 A1*   6/2006  Brunette et al. ............... 333/33

* cited by examiner

*Primary Examiner*—Benny Lee
*Assistant Examiner*—Gerald Stevens
(74) *Attorney, Agent, or Firm*—McGinn IP Law Group, PLLC

(57) ABSTRACT

A composite via structure in a multilayer printed circuit board (PCB) and also compact and shielded filters formed by the use of composite via structures as building blocks are provided. The composite via structure consists of two functional parts. The first functional part is designed to form an interconnected circuit with low return and leakage losses between the first pad disposed at the one side of the PCB and the special pad serving for a connection to a planar transmission line. The second functional part of the composite via structure serves to form a shielded open- or short-circuited resonant length (stub) extended in the vertical direction from the special pad to the second pad disposed at the opposite side of the PCB.

20 Claims, 25 Drawing Sheets

COMPOSITE VIA STRUCTURES AND FILTERS IN MULTILAYER PRINTED CIRCUIT BOARDS

FIELD

This invention relates generally to via structures and filters in multilayer printed circuit boards (PCBs). More specifically, the invention relates to composite via structures providing new compact filters including bandpass and bandstop ones in the multilayer PCB.

BACKGROUND

Usually a via structure in a multilayer printed circuit board (PCB) serves as a vertical transition between planar interconnected circuits based on planar transmission lines such as microstrip lines, striplines, coplanar lines and so on formed at different conductor layers of the PCB and are developed under the conditions providing low return and radiation (leakage) losses whole interconnect circuits used in electronic devices. These conditions stimulate the development different via structures such as blind vias, buried vias, shielded vias and so on.

To develop components and devices based on PCB technologies, in particular filters, resonant lengths of the planar transmission lines such as open- or short-circuited stubs are usually used. Variety of forms and dimensions of planar transmission line stubs be applied as building blocks gives a possibility to develop lowpass, highpass, bandstop and bandpass filters at different frequency bands. However, a planar structure of transmission line resonant stubs can lead to comparably large dimensions of filters as for an example at the frequency band up to 20 GHz. Also radiation (leakage) losses can be considerable in such discontinuities as planar transmission line stubs.

SUMMARY OF THE INVENTION

It is an object of the present invention to provide a composite via structure for a multilayer PCB uniting two functional parts. First functional part extends in the vertical direction from the first pad disposed at the one side of the PCB to the special pad embedded in the PCB for the connection to a planar transmission line and serves to implement a high-performance vertical transition between the first and special pads. In addition to the first and special pads, this functional part includes a signal via conductor connected to the first and special pads, a clearance hole, and ground vias surrounding the signal via conductor. Second functional part of the composite via structure forms a resonant length (stub) extended in the vertical direction from the special pad to the second pad disposed at the opposite side of the PCB. In additional to the second pad, this functional part includes the same signal via conductor connected to the second pad, ground vias surrounding the signal via conductor, but besides that conductive plates are formed at the conductor layers of the PCB. Each conductive plate is connected to the signal via conductor and is isolated from grounding conductors by an isolating slot.

It is another object to provide a compact filter in a multilayer PCB by means of the connection of the special pad of a composite via structure to a planar transmission line where the second functional part of the composite via structure forms open- or short-circuited resonant stub as a result of the isolation of the second pad of the composite via structure from ground conductors or the connection of the second pad to the ground conductors, respectively. Control of the resonance frequency of such stubs can be carried out by an appropriate choice of dimensions and forms of the conductive plates in the second part of the composite via structure. Open- and short-circuited resonant stubs, as parts of composite via structure, connected to the transmission line by means of the special pad act as compact filters. The first pad can be registered with the special pad in the composite via structure. In this case the composite via structure including open- or short-circuited resonant stub can be connected to a microstrip line to form a compact filter.

It is another object to provide different types of filters formed in a multilayer PCB as for example bandstop and bandpass ones by the use of a number of composite via structures with open- and short-circuited resonant stubs connected by means of the planar transmission line through the special pads of the composite via structures.

Three-dimensional arrangement of conductors in a filter developed by the use of composite via structures provides its compactness and the application of the ground vias provides its shielding and a high electrical performance.

DETAILED DESCRIPTION OF THE PREFERRED EMBODIMENTS

Figure 1A:
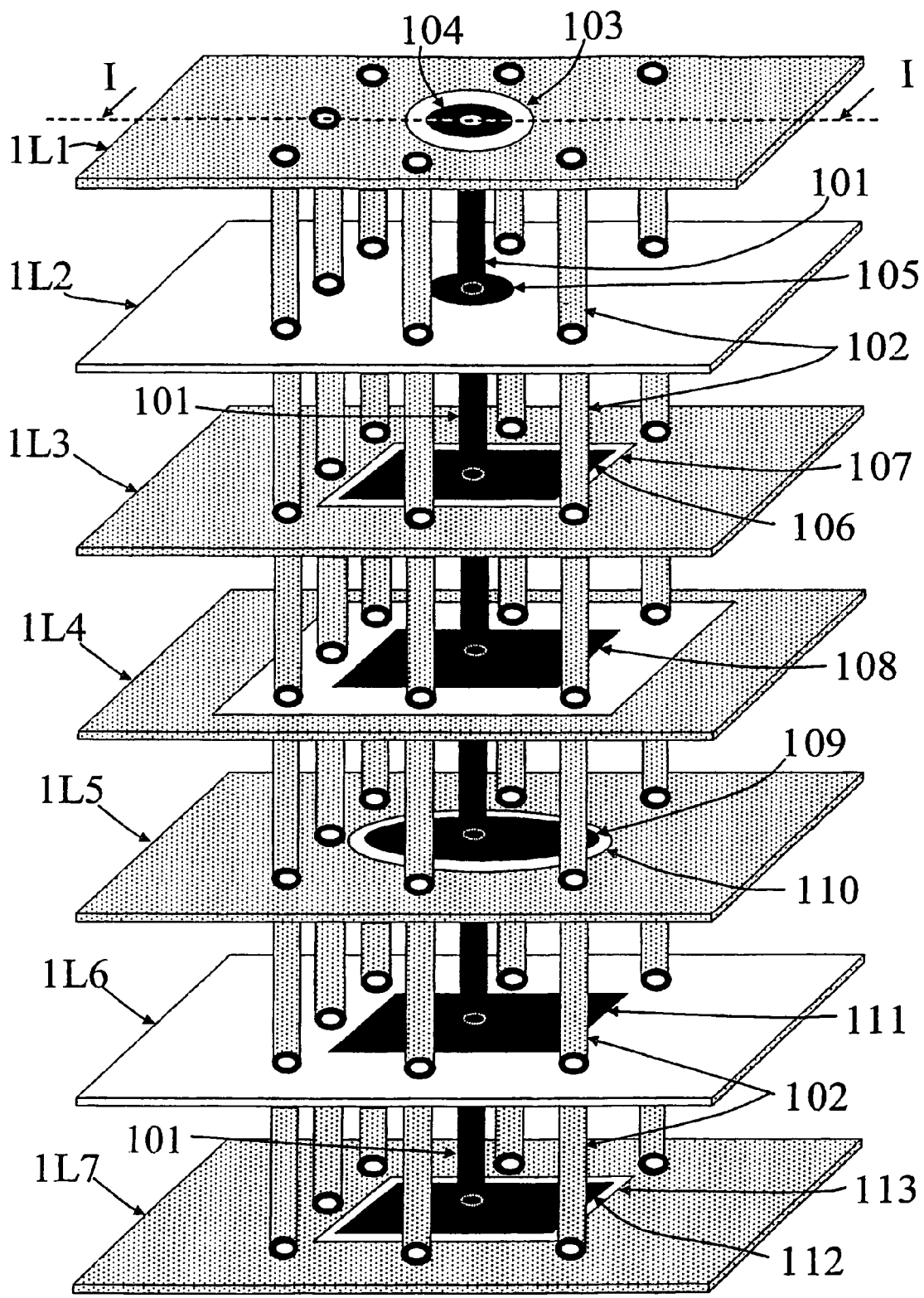
FIGS. 1A, 1B, 1C and 1D show perspective, cross-section I, top and bottom views, respectively, of a composite via structure intended to form shielded open-circuited resonant stub in a multilayer PCB.
Figure 1B:
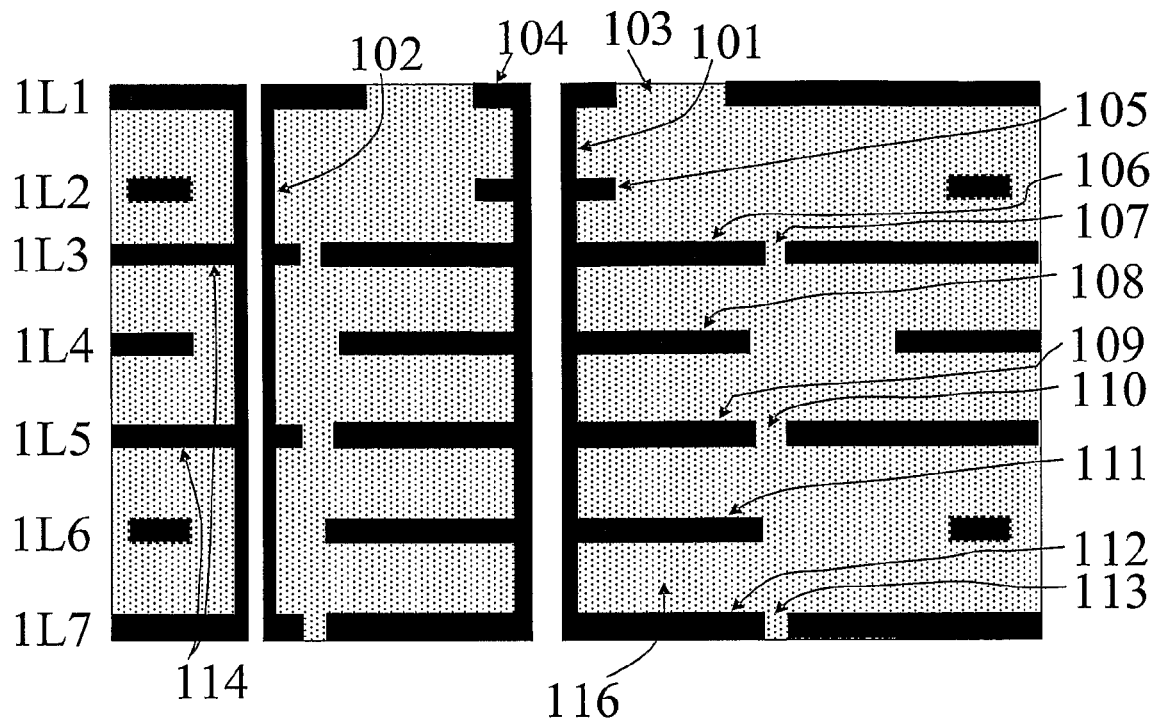
Figure 1C:
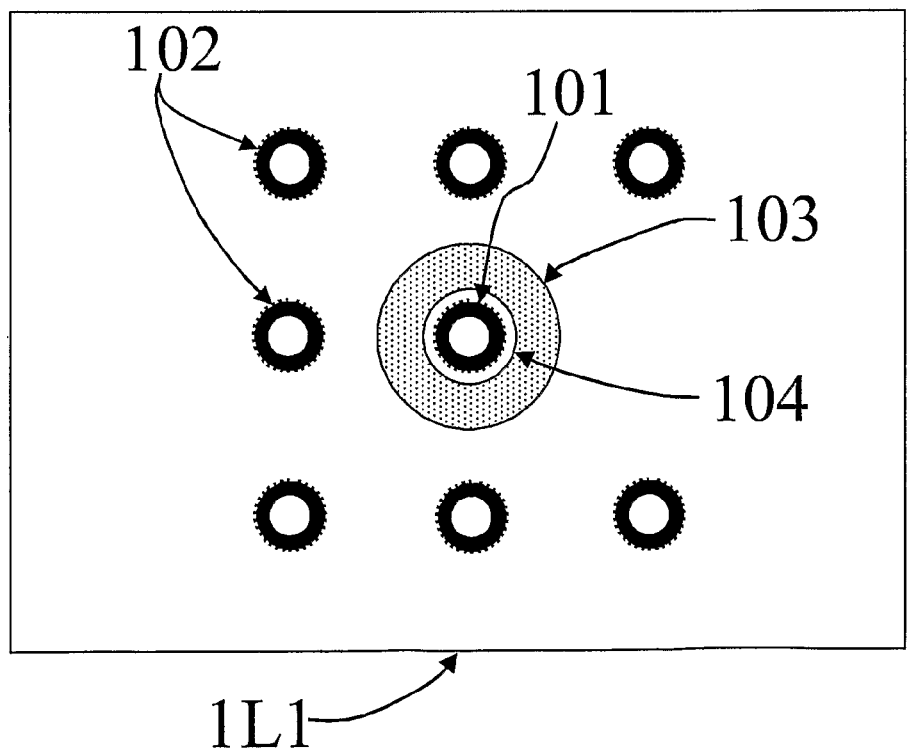
Figure 1D:
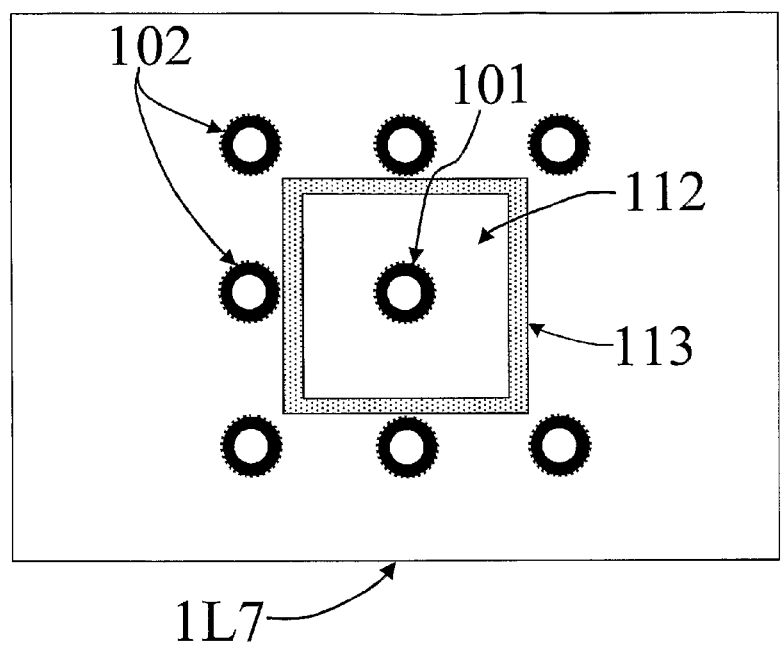

The following description of the preferred embodiments directed to only several examples of composite via structures and filters provided by the use of some composite via structures but it is well understood that this description should not be viewed as narrowing the claims which follows.

Referring to the drawings, a composite via structure in a 7-conductor-layer PCB, which serves only as an example of multilayer PCB design, is shown in FIGS. 1A, 1B, 1C and 1D. In these figures, the arrangement of conductor layers of the PCB separated by an isolating material 116 is as follows: Ground planes are 1L1, 1L3, 1L5 and 1L7 layers; Power supplying plane is 1L4 layer; and signal planes are 1L2 and 1L6 layers. The composite via structure unites two functional parts. First functional part provides a high-performance vertical transition from the first pad 104 to the special pad 105 disposed at the signal layer 1L2. Low return and leakage losses of this vertical transition including a signal via conductor 101, an assembly of ground vias 102 surrounding the signal via conductor 101 and a clearance hole 103 are realized by means of controlling the characteristic impedance of the vertical transition using an appropriate interval between the signal via conductor 101 and the ground vias 102. Second functional part of the composite via structure is intended to provide a resonant open-circuited stub extended in the vertical direction from the special pad 105 to the second pad 112. In additional to the second pad 112, this functional part includes the same signal via conductor 101, the same assembly of ground vias 102, and conductive plates 106, 108, 109 and 111 are connected to the signal via conductor 101. These conductive plates are isolated from other conductors of the PCB, such as grounding conductors 114, by isolating slots and serve to control the resonance frequency of the open-circuited stub. As for an example at the ground layers of the PCB isolating slots 107 and 110 are provided. To form an open-circuited resonant stub the second pad 112 is separated from the grounding conductors at the conductor layer 1L7 by an isolating slot 113. Note that the assembly of ground vias 102 provides not only shielding of the open-circuited resonant stub but also its high quality factor (Q-factor).

Figure 2A:
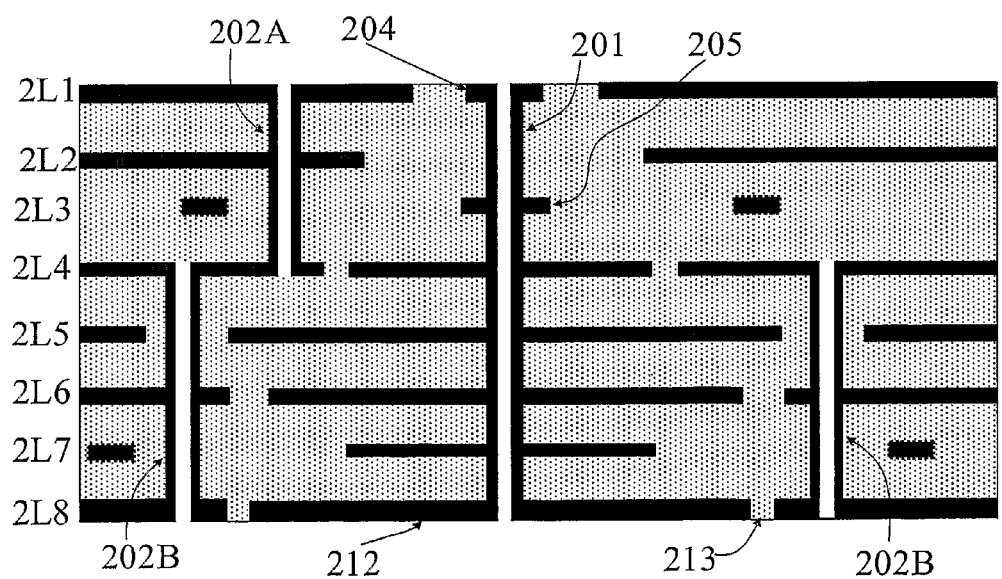
FIGS. 2A, 2B and 2C show cross-sectional, top and bottom views, respectively, of a composite via structure intended to form shielded open-circuited resonant stub in a multilayer PCB and including two different assemblies of ground vias.
Figure 2B:
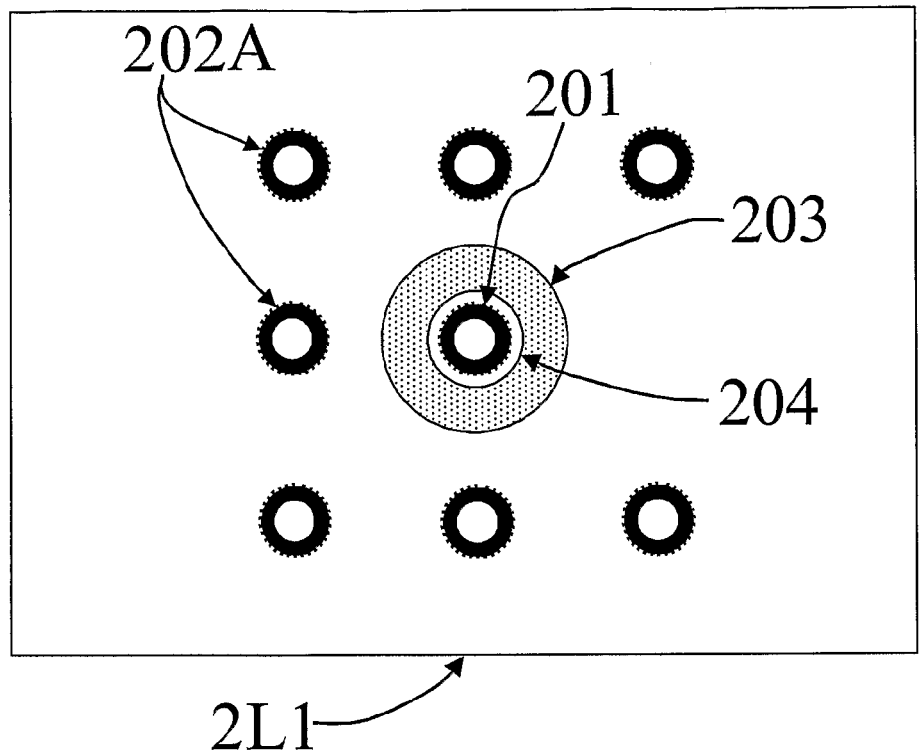
Figure 2C:
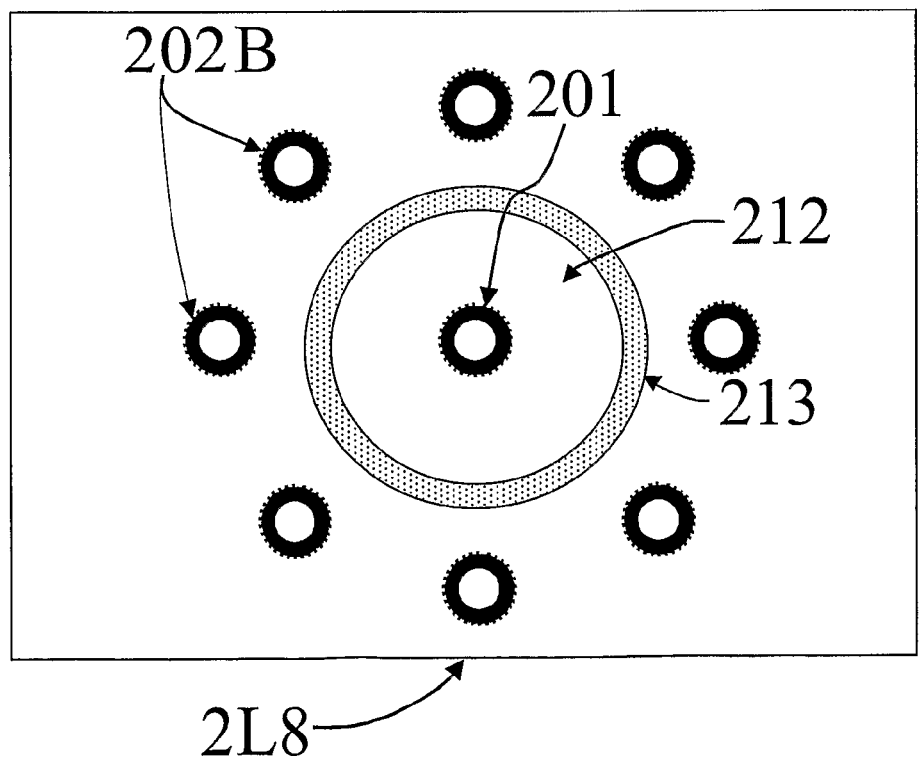

FIGS. 2A, 2B and 2C show a composite via structure in an 8-conductor-layer PCB, which includes conductor layers 2L1-2L8, compounding two functional parts. First functional part is extended in the vertical direction from the first pad 204 to the special pad 205 serving to connect a planar transmission line at the same conductor layer 2L3 to the composite via structure. Second functional part is extended in the vertical direction from the special pad 205 to the second pad 212. A distinguishing feature of this composite via structure is the use of two different assemblies of ground vias surrounding the signal via conductor 201. One assembly of ground vias 202A is applied to form a high-performance vertical transition in the first functional part of the composite via structure and is extended in the vertical direction from the conductor layer 2L1 to the ground layer 2L4 participating in forming a planar transmission line at the conductor layer 2L3. Another assembly of ground vias 202B surrounding the signal via conductor 201 is used to provide the shielding and a high Q-factor resonant open-circuited stub in which the second pad 212 is separated by an isolating slot 213 from grounding conductor at the conductor layer 2L8.

Figure 3A:
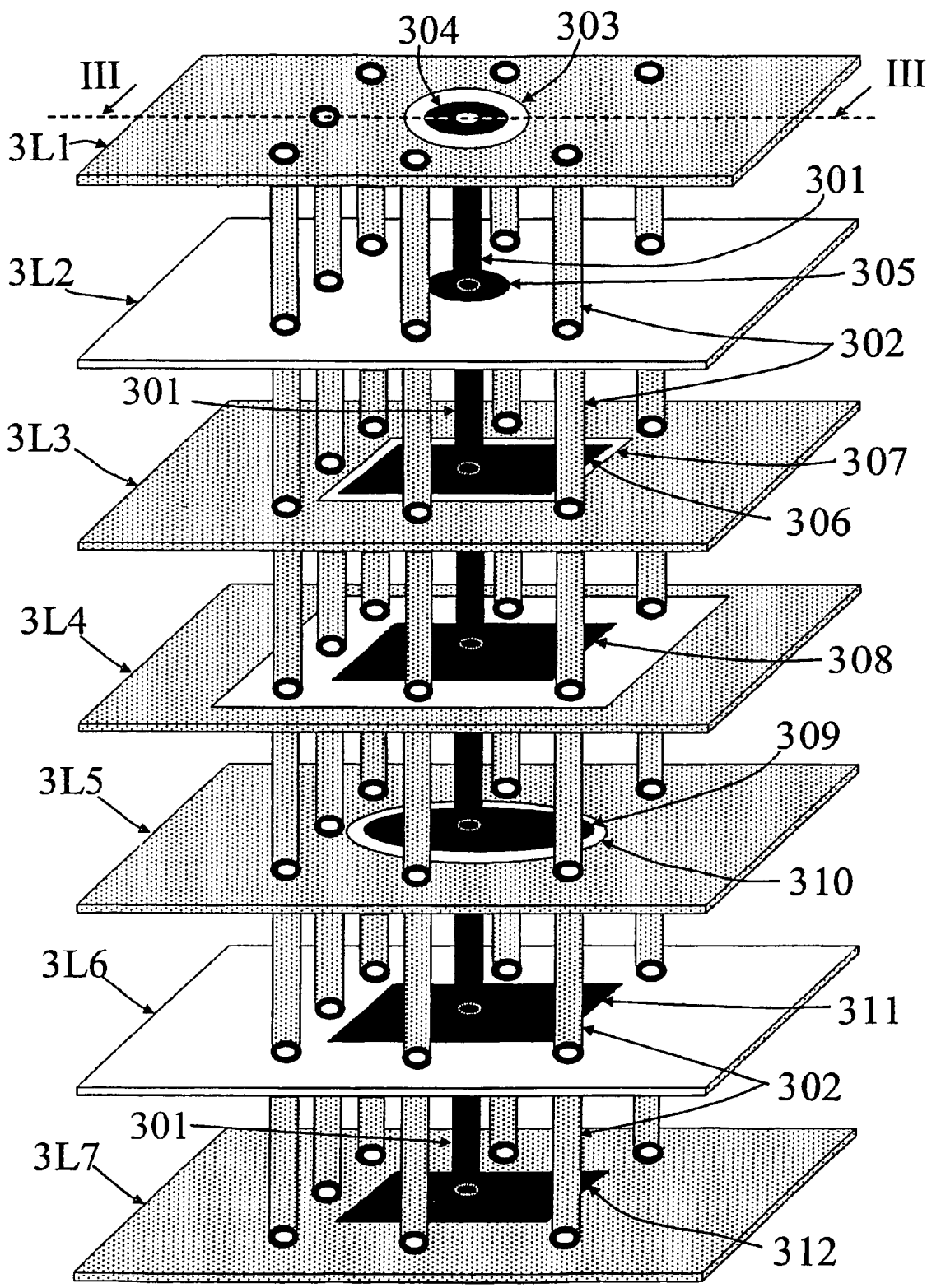
FIGS. 3A, 3B, 3C and 3D show perspective, cross-section III, top and bottom views, respectively, of a composite via structure intended to form shielded short-circuited resonant stub in a multilayer PCB.
Figure 3B:
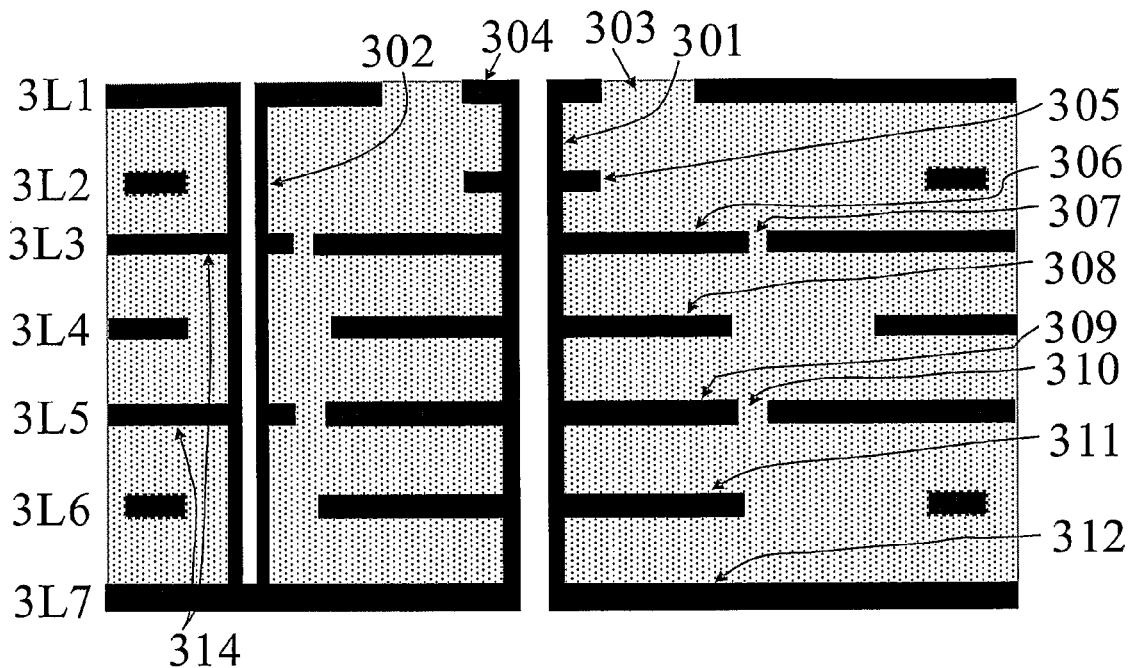
Figure 3C:
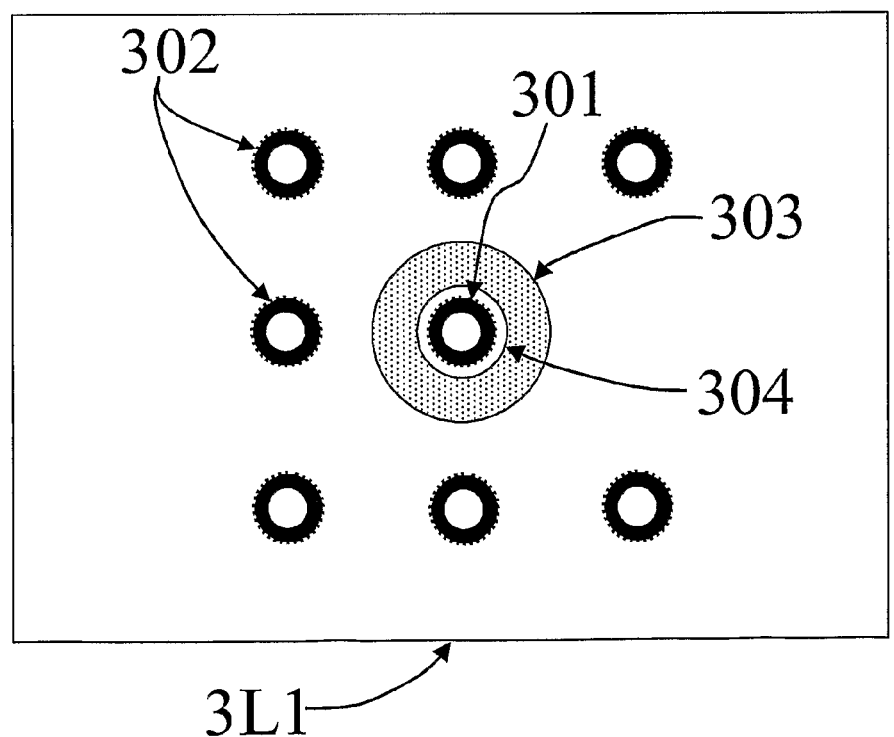
Figure 3D:
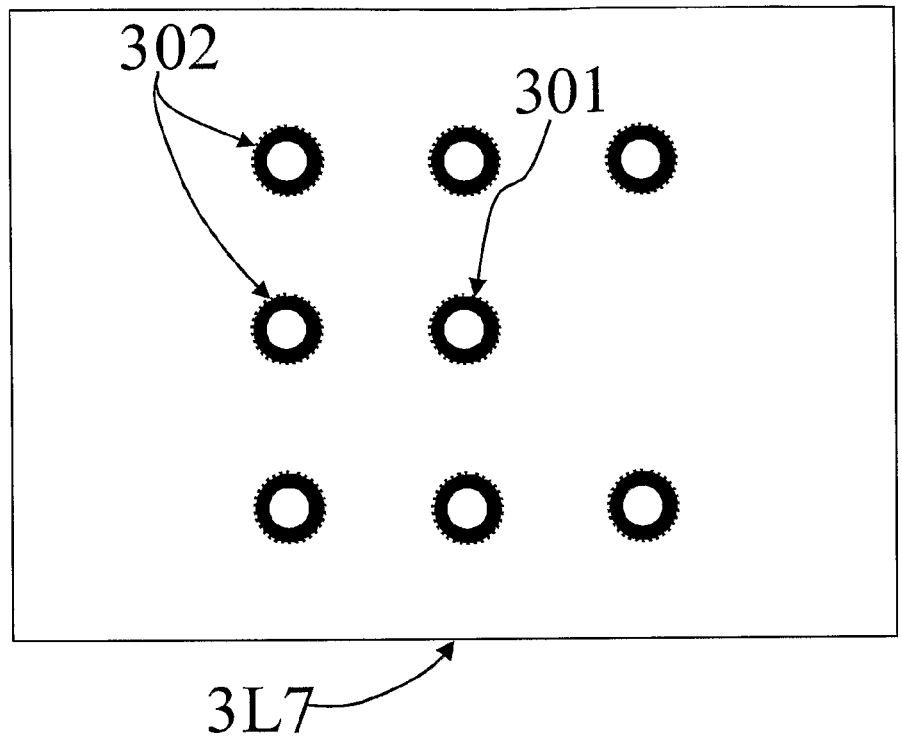

In FIGS. 3A, 3B, 3C and 3D, another composite via structure in a 7-conductor-layer PCB, which includes conductor layers 3L1-3L7, is shown. This composite via structure includes two functional parts. The first functional part provides a high-performance vertical transition from the first pad 304 to the special pad 305 disposed at the signal layer 3L2. This vertical transition includes a signal via conductor 301, an assembly of ground vias 302 surrounding the signal via conductor 301 and a clearance hole 303. The second functional part is intended to provide a resonant short-circuited stub extended in the vertical directions from the special pad 305 to the second pad 312 disposed at the conductor layer 3L7 of the PCB. This functional part includes the same signal via conductor 301, the same assembly of ground vias 302, and conductive plates 306, 308, 309 and 311 connected to the signal via conductor 301. These conductive plates are separated from other conductors of the PCB, such as grounding conductors 314, by isolating slots and serve to control the resonance frequency of the short-circuited stub. At the ground layers of the PCB, as shown in the FIG. 3A, isolating slots 307 and 310 are provided. Short-circuited resonant stub is formed due to the connection of the second pad 312 to the ground plane disposed at the conductor layer 3L7.

Figure 4A:
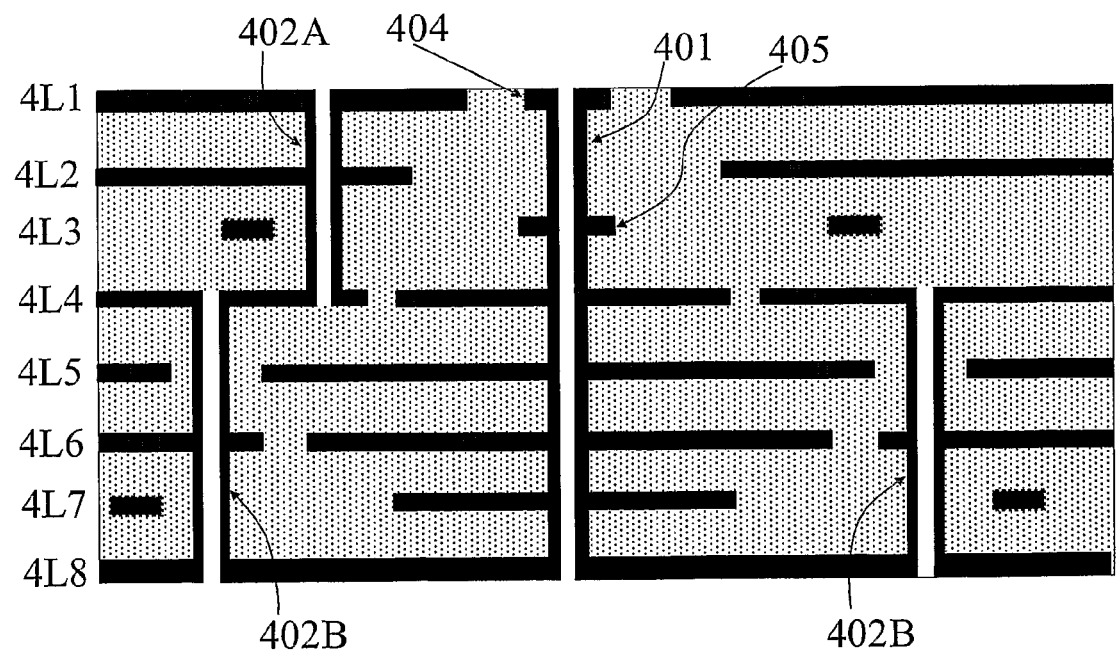
FIGS. 4A, 4B and 4C show cross-sectional, top and bottom views, respectively, of a composite via structure intended to form shielded short-circuited resonant stub in a multilayer PCB and including two different assemblies of ground vias.
Figure 4B:
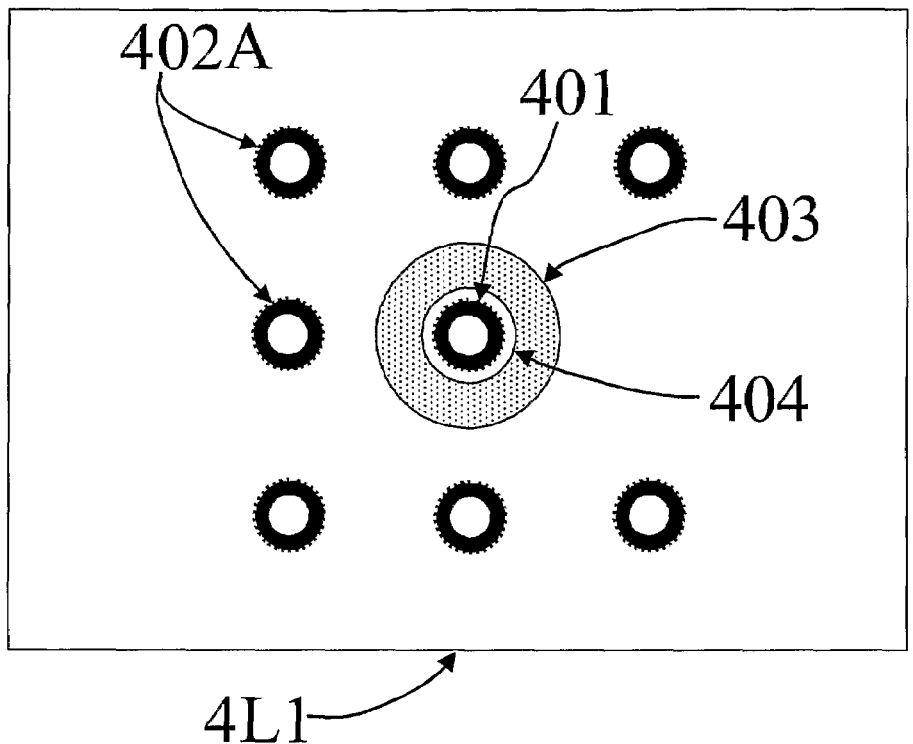
Figure 4C:
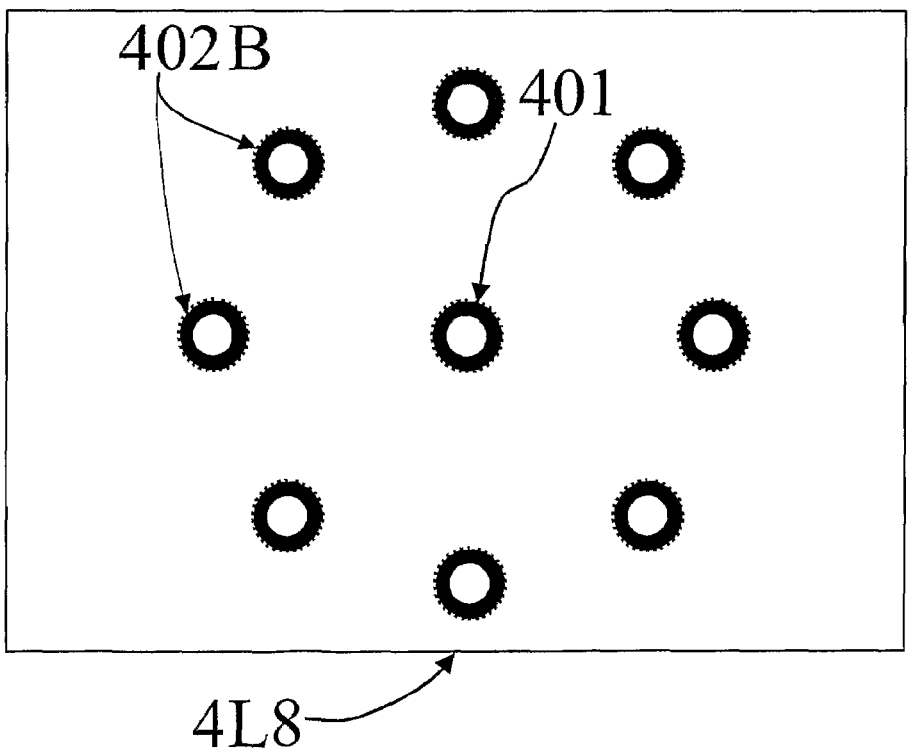

FIGS. 4A, 4B and 4C show a composite via structure in an 8-conductor-layer PCB, which includes conductor layers 4L1-4L8, compounding two functional parts. First functional part is extended in the vertical direction from the first pad 404, which is encircled by clearance hole 403, to the special pad 405 serving for connection of a planar transmission line formed at the same conductor layer 4L3 to the composite via structure. Second functional part is extended in the vertical direction from the special pad 405 to the ground plane disposed at the conductor layer 4L8. In this composite via structure two different assemblies of ground vias surrounding the signal via conductor 401 are used. One assembly of ground vias 402A is applied to form a high-performance vertical transition in the first functional part of the composite via structure and is extended in the vertical direction from the conductor layer 4L1 to the ground layer 4L4 participating in forming a planar transmission line at the conductor layer 4L3. Another assembly of ground vias 402B surrounding the same signal via conductor 401 is used to provide the shielding and high Q-factor resonant short-circuited stub in which the second pad is connected to the ground plane at the conductor layer 4L8.

Figure 5A:
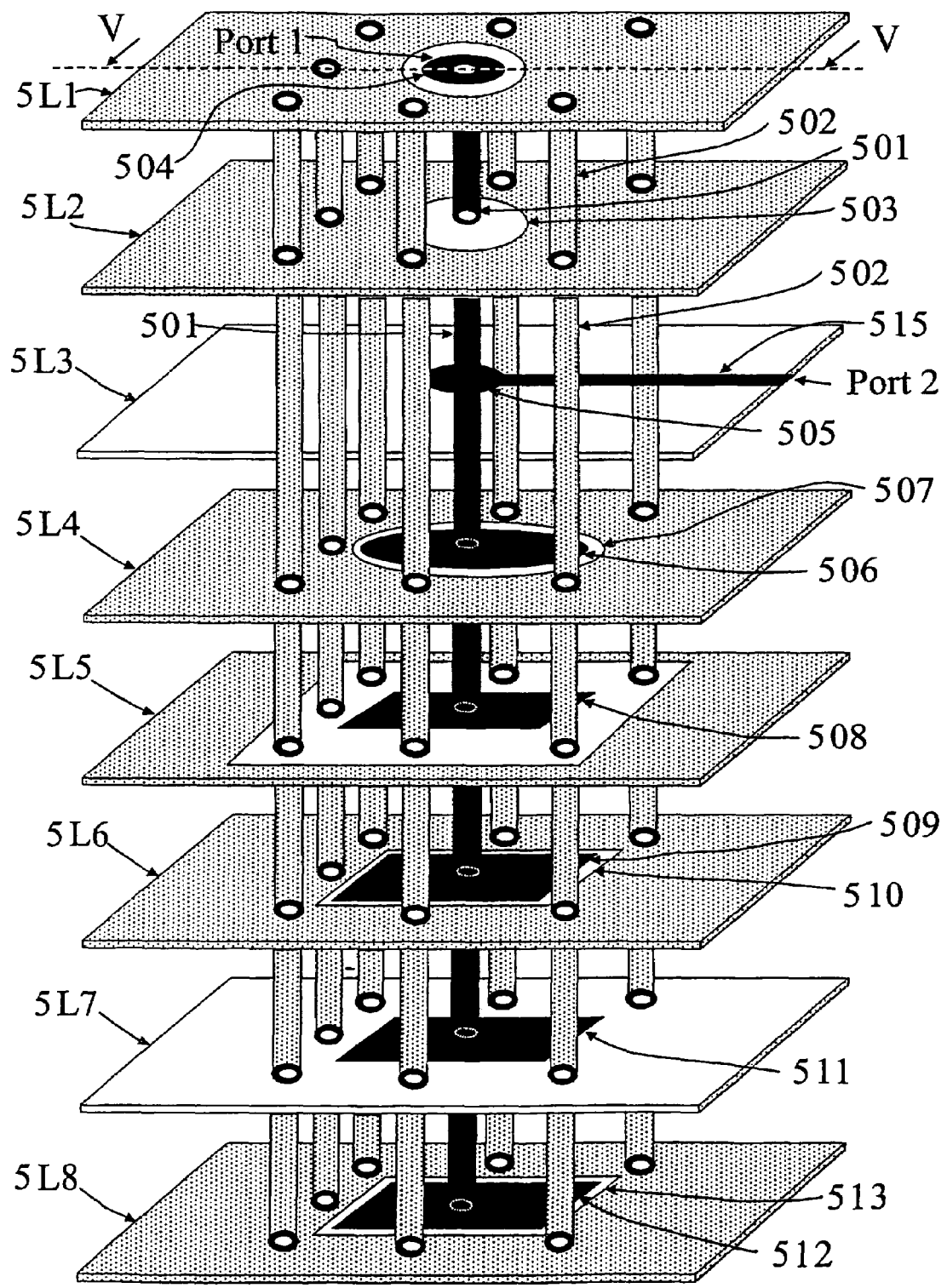
FIGS. 5A and 5B show perspective and cross-section V views, respectively, of a filter due to forming an open-circuited resonant stub obtained by the connection of a composite via structure to a stripline in a multilayer PCB.
Figure 5B:
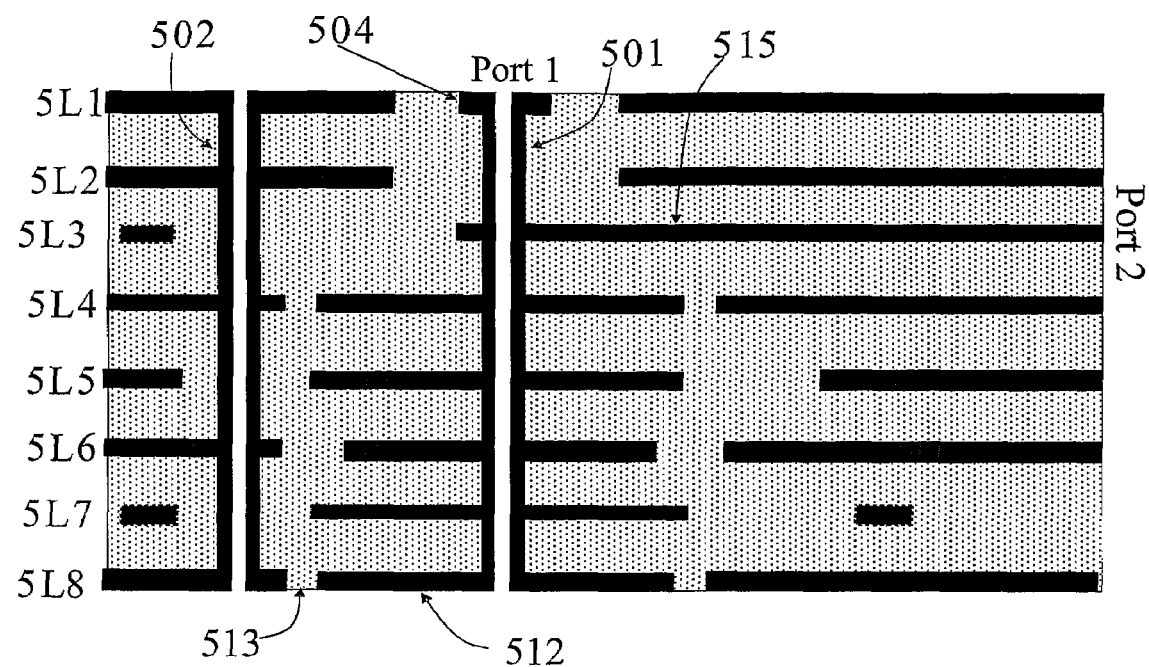

FIGS. 5A and 5B show perspective and cross-sectional views, respectively, of a filter in an 8-conductor-layer PCB, which includes conductor layers 5L1-5L8. This filter is formed by a composite via structure providing an open-circuited resonant stub and a stripline 515 formed at the 5L3 conductor layer of the PCB and connected to the composite via structure by means of the special pad 505. Position of the resonance frequency of the filter can be controlled by dimensions of the conductive plates 506, 508, 509 and 511 and second pad 512 at the eight conductor layer of the PCB connected to a signal via conductor 501 and separated from ground conductor by an isolating slot 513. Shielding and high Q-factor of the filter is provided by the use of an assembly of ground vias 502. Input/output ports of the filter are at the first pad 504 of the composite via structure and the stripline 515 as shown in FIGS. 5A and 5B. Conductive plates 506 and 509 are encircled by isolating slots 507 and 510 respectively, Layer 5L2 includes clearance hole 503.

It should be noted to define resonance frequencies of the filter like that shown in FIGS. 5A and 5B, three-dimensional full-wave electromagnetic field simulations are necessary due to a complicated three-dimensional structure of the filter. As for an example, the finite-difference time-domain (FDTD) algorithm can be used to define complex scattering (S-parameter) matrix which is defined as the quotient between the output signal spectrum and the input signal spectrum. For this aim, a three-dimensional full-wave simulator can be applied to calculate the electrical performance of the filter and its resonance frequencies. Also one can define a desired resonance frequency of the filter by a gradual change of the dimensions of conductive plates connected to the signal via conductor and the second pad in the second functional part of the filter.

Figure 6A:
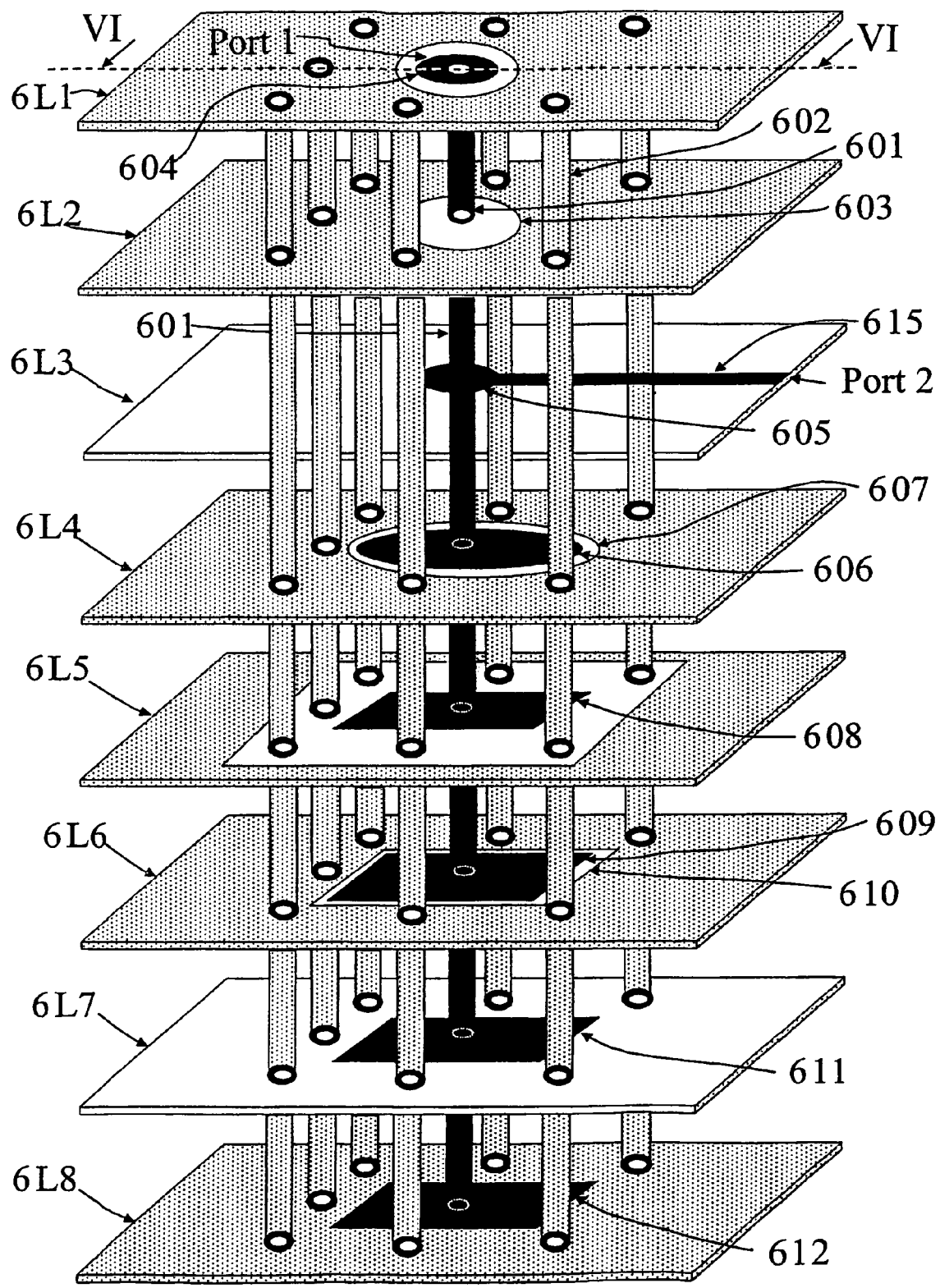
FIGS. 6A and 6B show perspective and cross-section VI views, respectively, of a filter due to forming a short-circuited resonant stub obtained by the connection of a composite via structure to a stripline in a multilayer PCB.
Figure 6B:
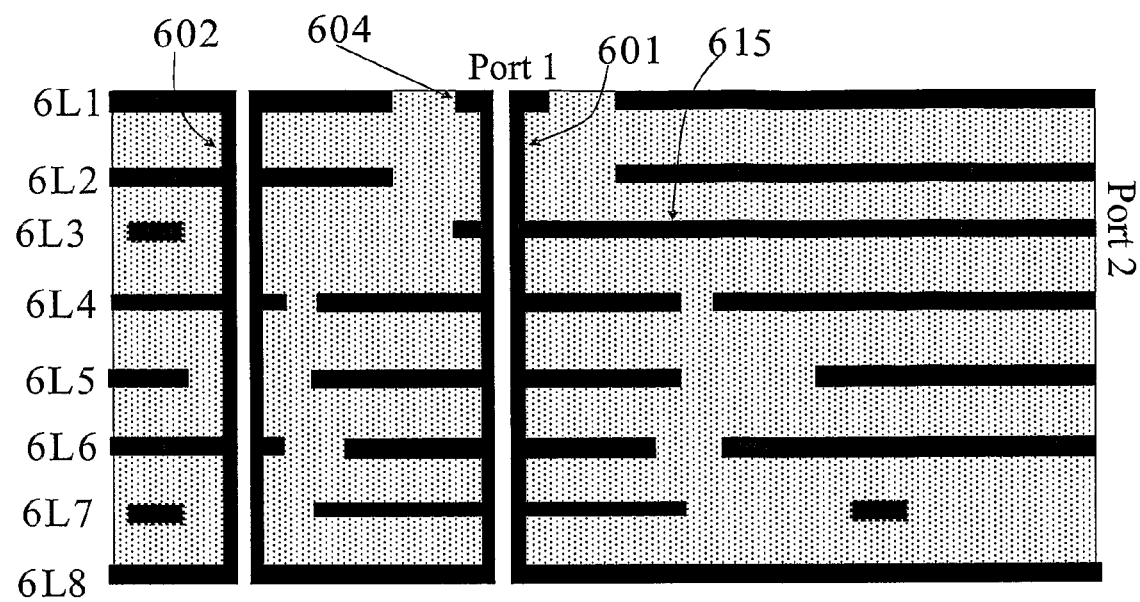
Figure 7A:
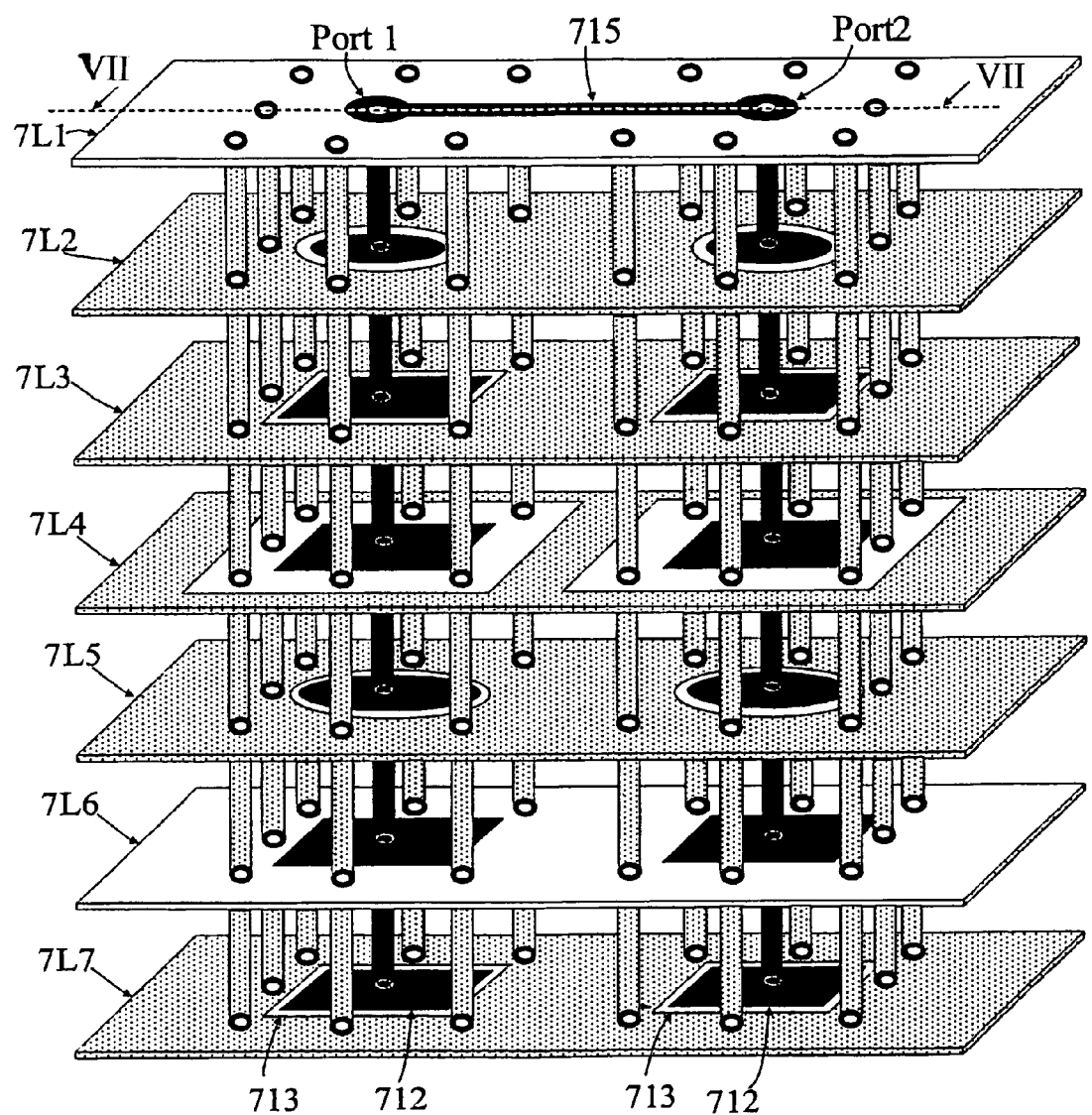
FIGS. 7A, 7B, 7C and 7D show perspective, cross-section VII, top and bottom views, respectively, of a filter formed by two open-circuited resonant stubs and provided by the connection of two composite via structures by means of a microstrip line in a multilayer PCB.
Figure 7B:
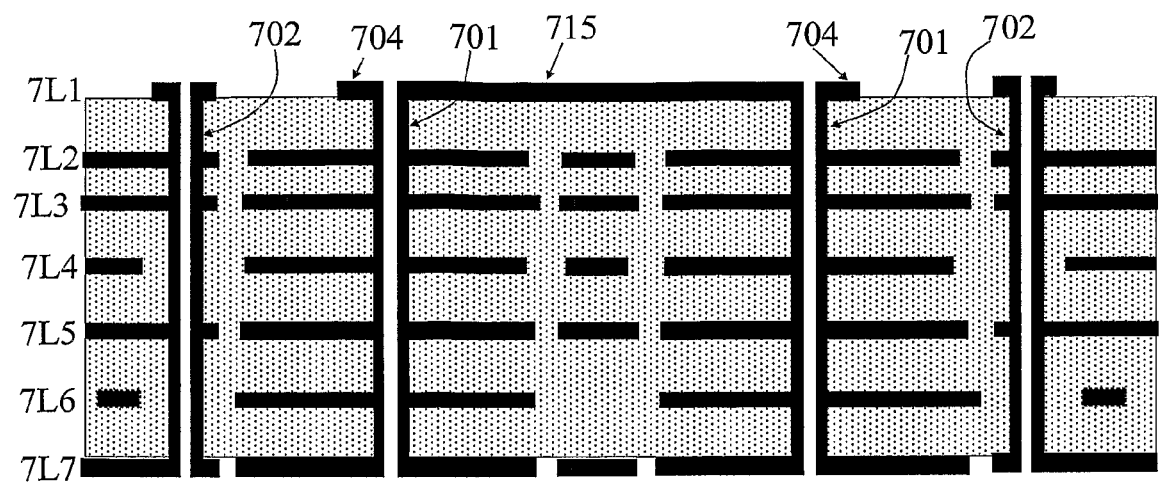
Figure 7C:
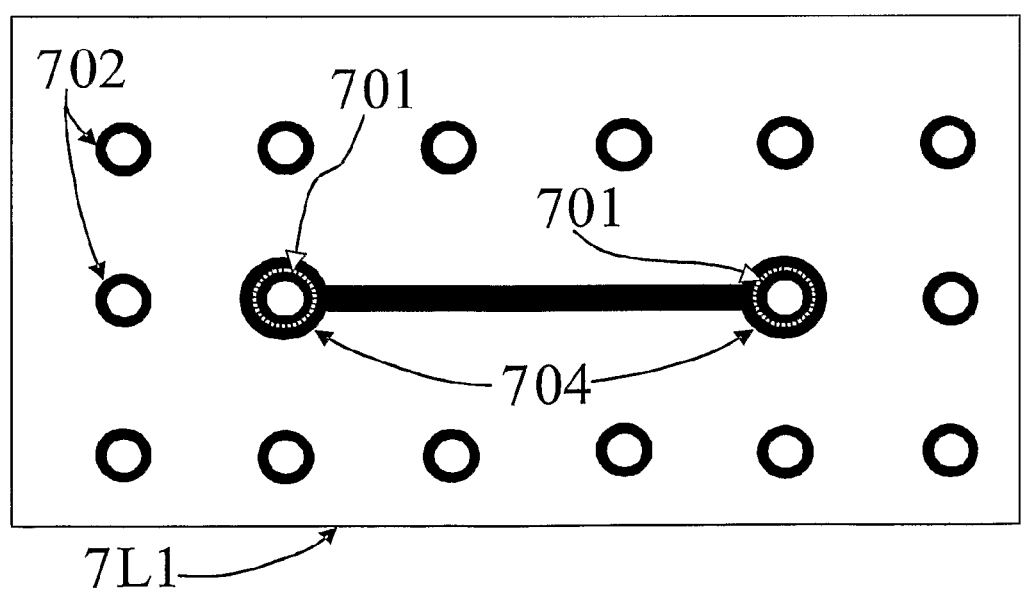
Figure 7D:
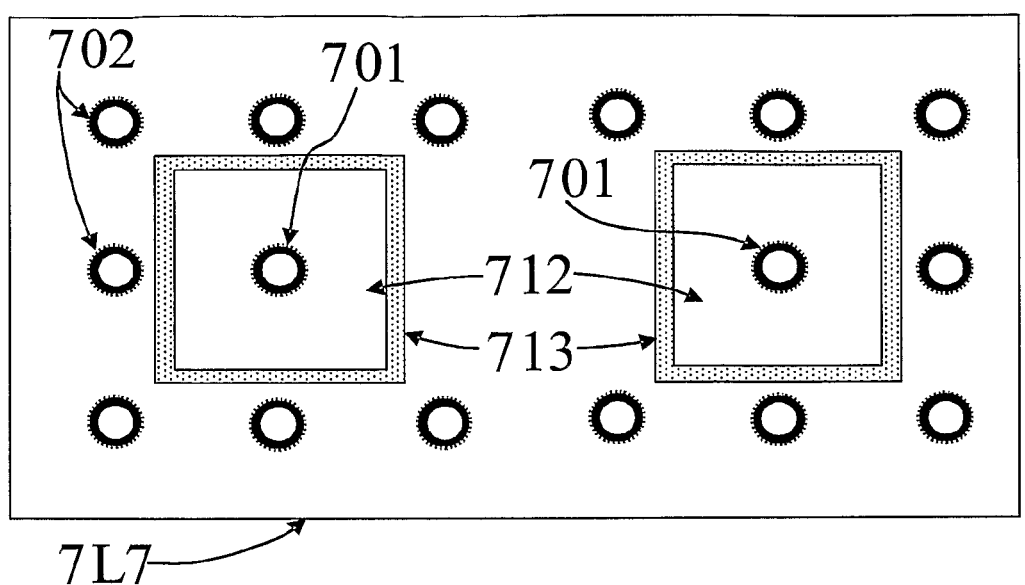
Figure 8A:
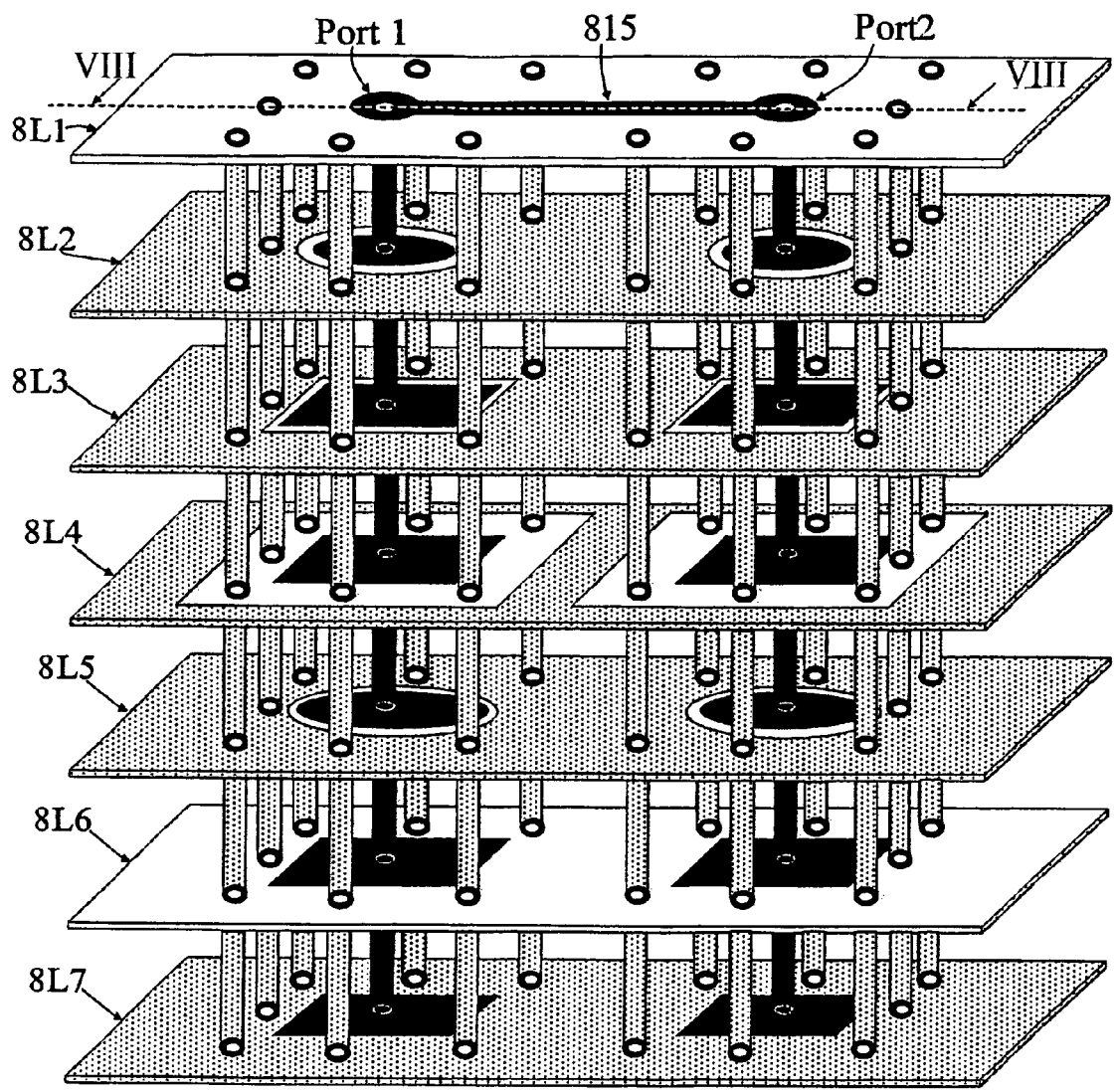
FIGS. 8A, 8B, 8C and 8D show perspective, cross-section VIII, top and bottom views, respectively, of a filter formed by two short-circuited resonant stubs and provided by the connection of two composite via structures by means of a microstrip line in a multilayer PCB.
Figure 8B:
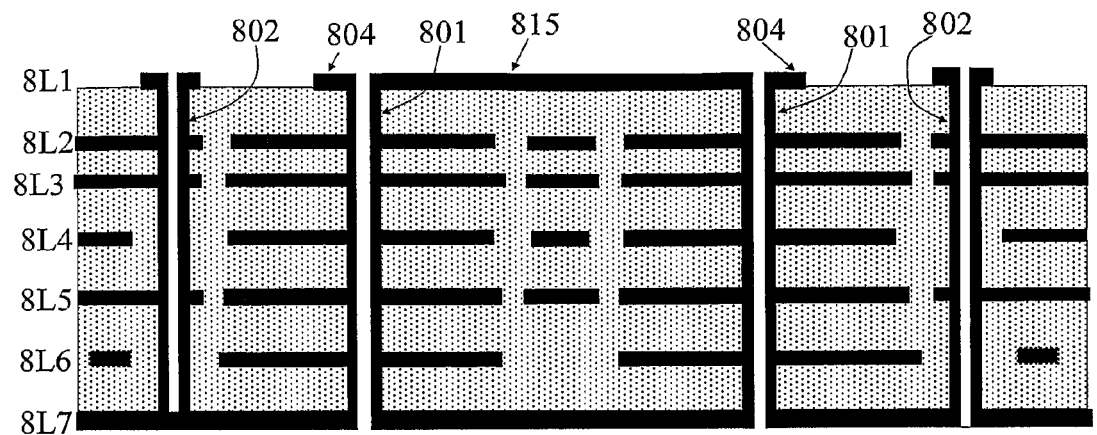
Figure 8C:
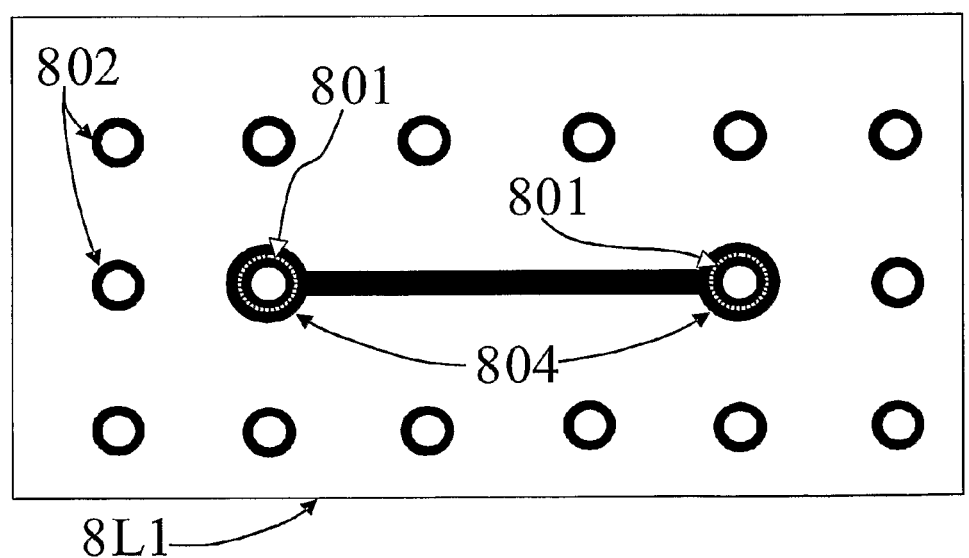
Figure 8D:
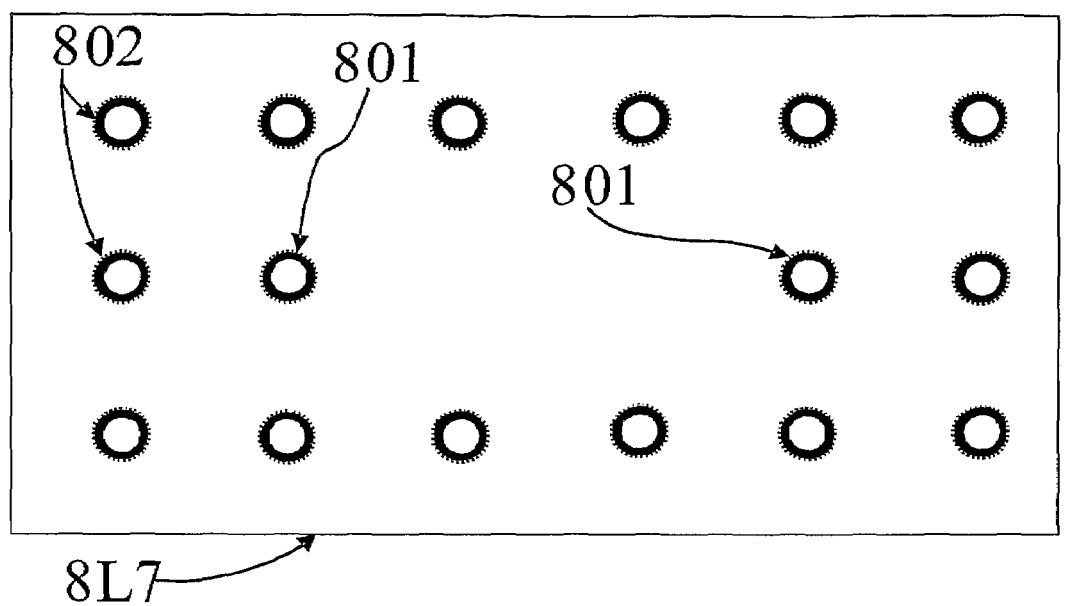

FIGS. 6A and 6B show perspective and cross-sectional views, respectively, of a filter in an 8-conductor-layer PCB, which includes conductor layers 6L1-6L8. This filter is formed by a composite via structure providing a short-circuited resonant stub and a stripline 615 formed at the conductor layer 6L3 of the PCB connected to the composite via structure by means of the special pad 605. Position of the resonance frequency of the filter can be controlled by dimensions of the conductive plates 606, 608, 609 and 611 connected to a signal via conductor 601. Shielding and high Q-factor of the filter is provided by the use of an assembly of ground vias 602. The second pad 612 of the composite via structure is connected to ground plate at the conductor layer 6L8 of the PCB. Ports of the filter are at the first pad 604 of the composite via structure and the stripline 615 as shown in FIGS. 6A and 6B. Conductive plates 606 and 609 are encircled by isolating slots 607 and 610 respectively, Layer 6L2 includes clearance hole 603.

In FIGS. 7A, 7B, 7C and 7D perspective, cross-sectional, top and bottom views of a filter designed by the use two composite via structures in a 7-conductor-layer PCB, which includes conductor layers 7L1-7L7, are shown. These composite via structures are connected by means of a microstrip line 715. Ports of the filters are first pads 704 which are registered with specials pads of the composite via structures. Open-circuited resonant stubs of the filters are obtained by the separation of the second pads 712 of the composite via structures by isolating slots 713. Control of bandpass and bandstop characteristics of the filter can be carried out by an appropriate choice of the dimensions of the conductive plates connected to the signal via conductors 701 and dimensions of the second pads 712. Also optimization of the parameters of the filter can be provided by the determination of an appropriate length of the microstrip line 715. Shielding properties and high Q-factor of the filters are provided by assemblies of ground vias 702 surrounding the signal via conductors 701.

Another type of filters provided by two composite via structures connected by means of a microstrip line 815 in a 7-conductor-layer PCB, which includes conductor layers 8L1-8L7, is shown in FIGS. 8A, 8B, 8C and 8D. Ports of the filters are first pads 804 which are coincided with specials pads of the composite via structures. Short-circuited resonant stubs of the filters are obtained by the connection of the second pads of the composite via structures to ground plate disposed at the 8L7 layer. Control of bandpass and bandstop characteristics of the filter is carried out by an appropriate choice of the dimensions of the conductive plates connected to the signal via conductor 801. Also optimization of the parameters of the filter can be provided by the determination of an appropriate length of the microstrip line 815. Shielding properties and high Q-factor of the filters are provided by assemblies of ground vias 802 surrounding the signal via conductors 801.

Figure 9A:
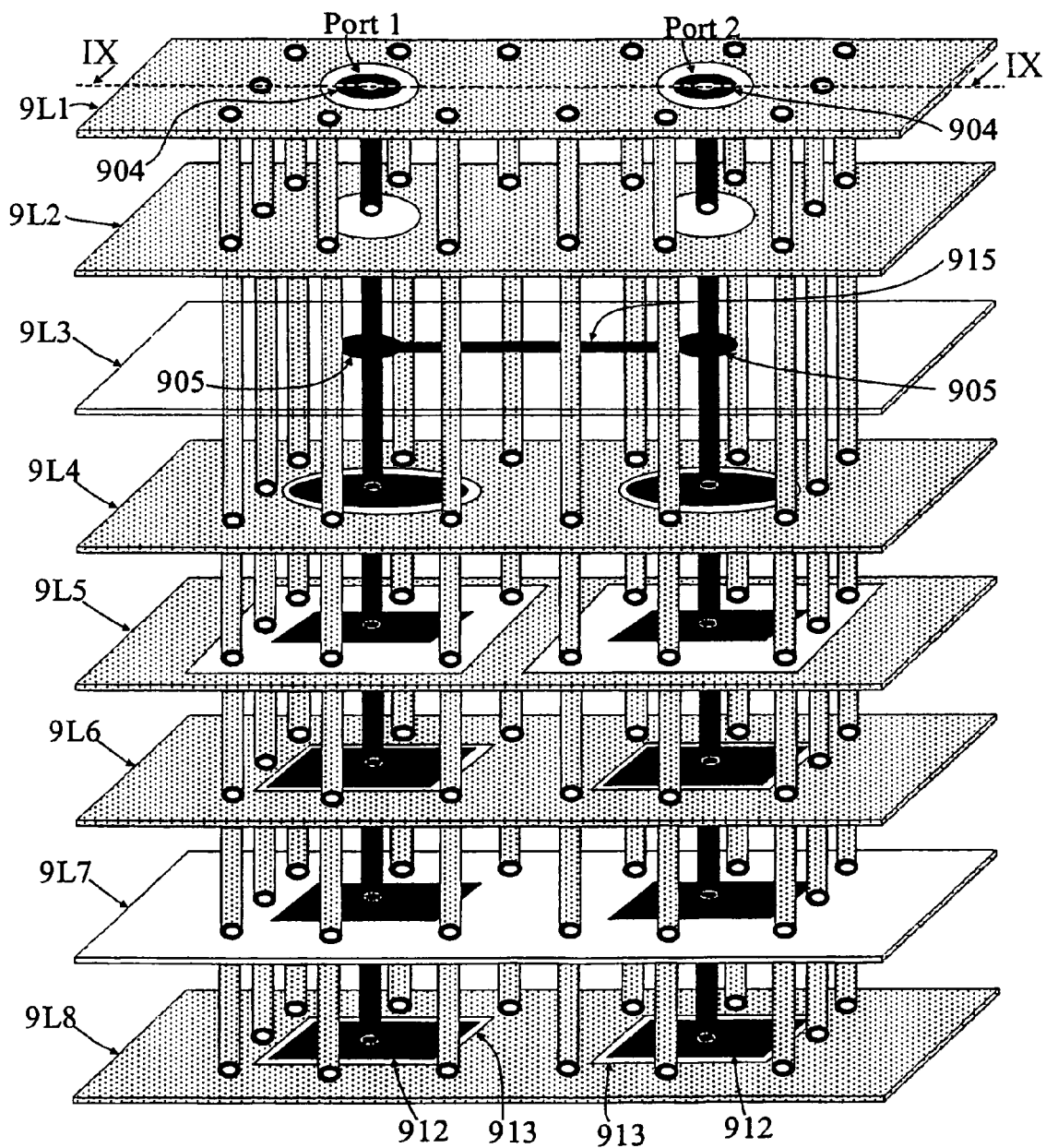
FIGS. 9A and 9B show perspective and cross-section IX views, respectively, of a filter formed by two open-circuited resonant stubs and provided by the connection of two composite via structures by means of a stripline in a multilayer PCB.
Figure 9B:
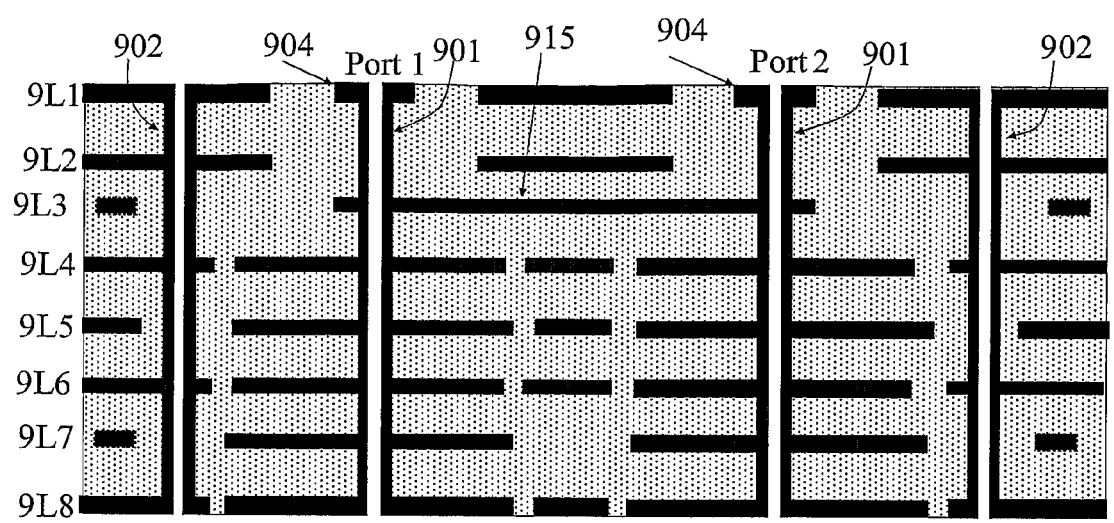

In FIGS. 9A and 9B, perspective and cross-sectional views of a filter designed by the use two composite via structures in an 8-conductor-layer PCB, which includes conductor layer 9L1-9L8, are shown. Used composite via structures include two functional parts of which first functional part provide low return and leakage losses in the vertical transition from the first pads 904 to a stripline 915 connected to the composite via structures by means of special pads 905. The stripline 915 and special pads 905 are disposed at the conductor layer 9L3. Ports of the filter are provided at the first pads 904 of the composite via structures. Second functional parts of the composite via structures provide resonant open-circuited stubs of the filter extended in the vertical direction from the special pads 905 to second pads 912 of the composite via structures which are isolated by slots 913 at the conductor layer 9L8. The second functional parts include conductive plates connected to the signal via conductors 901 and isolated from other conductors of the PCB. Control of bandpass and bandstop characteristics of the filter can be carried out by an appropriate choice of the dimensions of these conductive plates and dimensions of the second pads 912. Also an optimization of the parameters of the filter can be provided by the determination of an appropriate length of the stripline 915. Shielding properties and high Q-factor of the filter are provided by assemblies of ground vias 902 surrounding the signal via conductors 901.

Figure 10A:
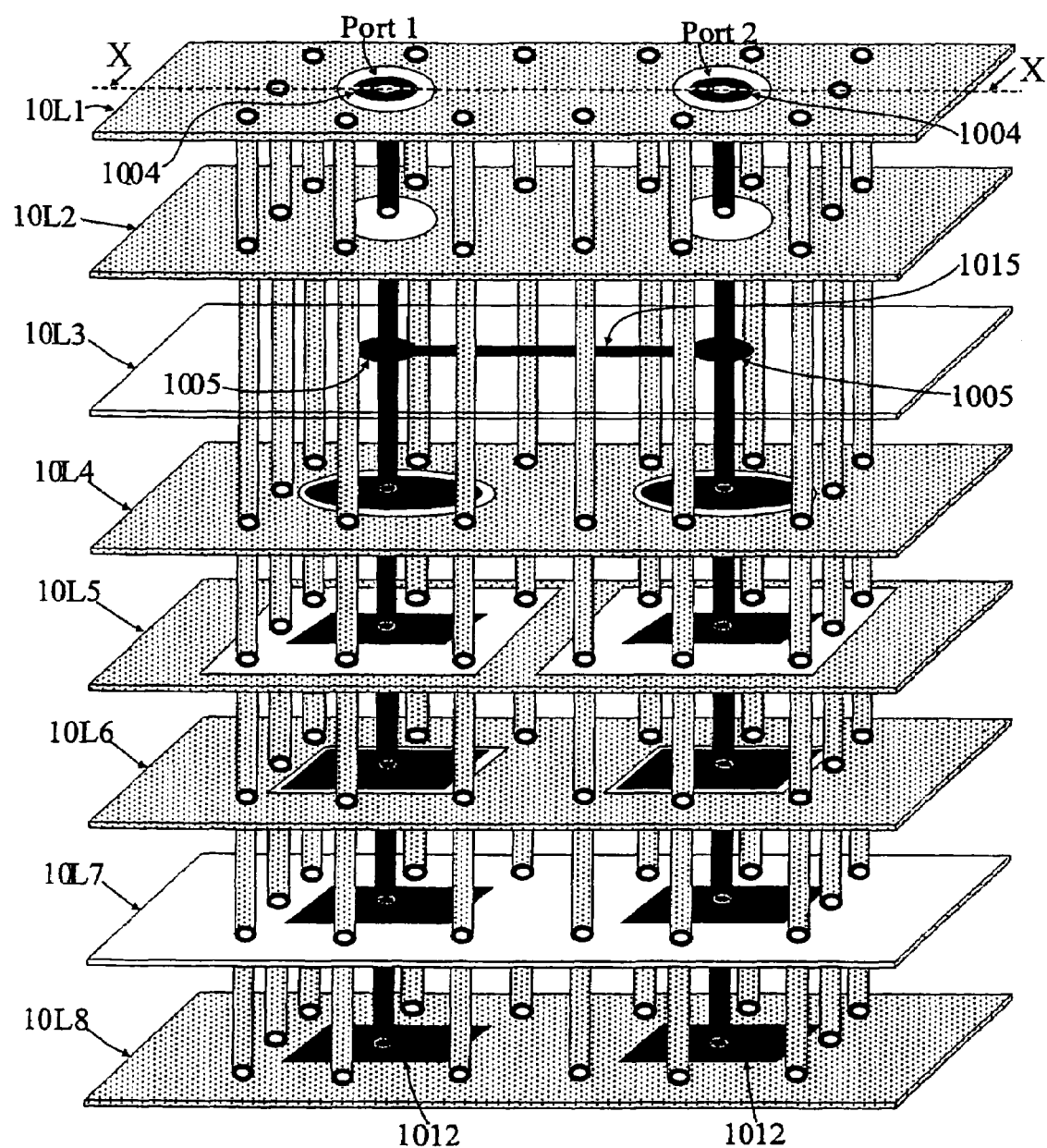
FIGS. 10A and 10B show perspective and cross-section X views, respectively, of a filter formed by two short-circuited resonant stubs and provided by the connection of two composite via structures by means of a stripline in a multilayer PCB.
Figure 10B:
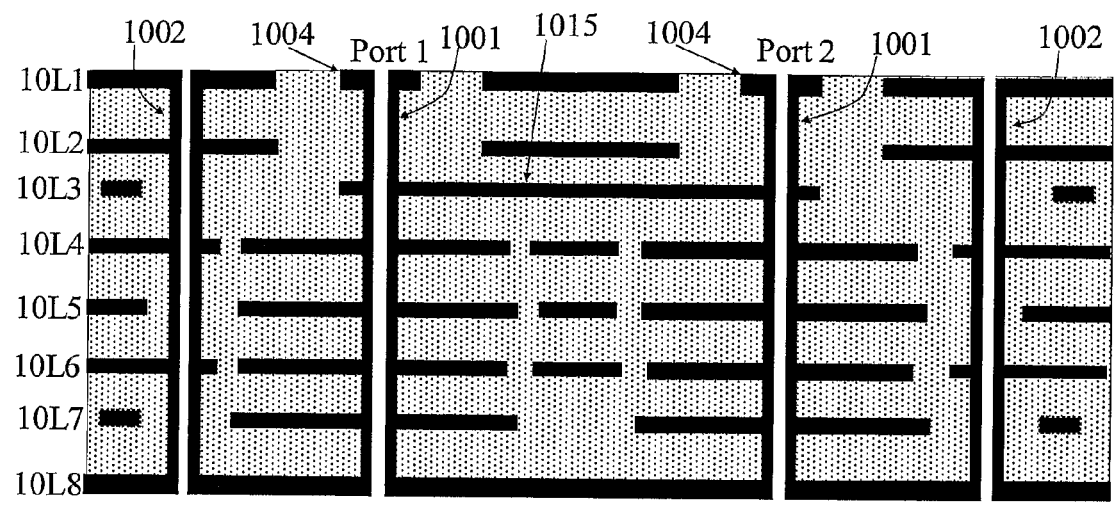

FIGS. 10A and 10B show perspective and cross-sectional views of a filter designed by the use two composite via structures in an 8-conductor-layer PCB, which includes conductor layers 10L1-10L8. The composite via structures include two functional parts of which first functional part provide low return and leakage losses in the vertical transition from the first pads 1004 to a stripline 1015 which connects two composite via structures by means of special pads 1005. The stripline 1015 and special pads 1005 are disposed at the 10L3 layer. Ports of the filter are provided at the first pads 1004 of the composite via structures. Second functional parts of the composite via structures provide resonant short-circuited stubs of the filter extended in the vertical direction from the special pads 1005 to the second pads 1012 of the composite via structures which are connected to the ground plane at the 10L8 conductor layer. The second functional parts include conductive plates connected to the signal via conductors 1001 and isolated from other conductors of the PCB. Control of bandpass and bandstop characteristics of the filter can be carried out by an appropriate choice of the dimensions of these conductive plates. Also optimization of the electrical parameters of the filter can be provided by the determination of an appropriate length of the stripline 1015. Shielding properties and high Q-factor of the filter are provided by assemblies of ground vias 1002 surrounding the signal via conductors 1001.

Arrangements of ground vias surrounding the signal via conductor in the composite via structure can be various. In above-mentioned cases, square arrangements of the ground vias in composite via structures were shown. It is well understood that this type of ground via arrangements is only an example used to describe a configuration of a filter formed by composite via structures. Using this example a way to determine the characteristic impedance of the first functional part of the composite via structure is shown as follows. The first functional part of the composite via structure with the square arrangement of ground vias can be considered in the form of the square coaxial transmission line in which the signal via conductor represents the inner conductive boundary and the assembly of ground vias surrounding the signal via conductor is replaced by the continuous conductive boundary and is considered as the outer conductive boundary of this square coaxial transmission line. This simplification gives a possibility to define the characteristic impedance of the first functional part as:

$$Z_{sq} \approx 60 \cdot \sqrt{\frac{1}{\varepsilon}} \cdot \ln\left(\frac{1.0787 \cdot R_{sq}}{r_{rod}}\right) \quad (1)$$

where $Z_{sq}$ is the characteristic impedance of the first functional part of the composite via structure, $R_{sq}=D_{sq}/2$ is the distance between the centers of the central signal via conductor and the nearest ground vias, $r_{rod}=d_{rod}/2$ is the outer radius of the central conductor, $\varepsilon$ is the relative permittivity of the PCB isolating material for which the relative permeability is equal to 1.

Thus, the Eq. 1 can be used to define the characteristic impedance of the first functional part of the composite via structure with a square arrangement of ground vias that is necessary to provide characteristic impedance matching of the first functional part and other interconnected structures.

Figure 11:
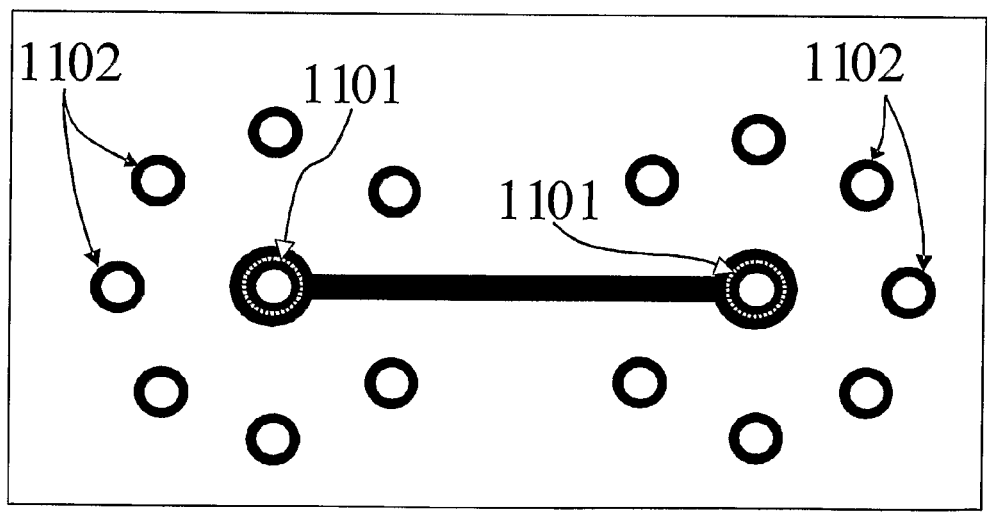
FIG. 11 shows a top view of a filter formed by two composite via structures in which each signal via conductor is surrounded by an assembly of ground vias with a round arrangement in a multilayer PCB.

In FIG. 11, an example of another arrangement of ground vias in the composite via structure is shown. In this round arrangement ground vias 1102 are equally spaced around a signal via conductor 1101. Moreover, for this arrangement of ground vias the simplified formula used for the determination of the characteristic impedance of a round coaxial transmission line can be also applied.

Figure 12:
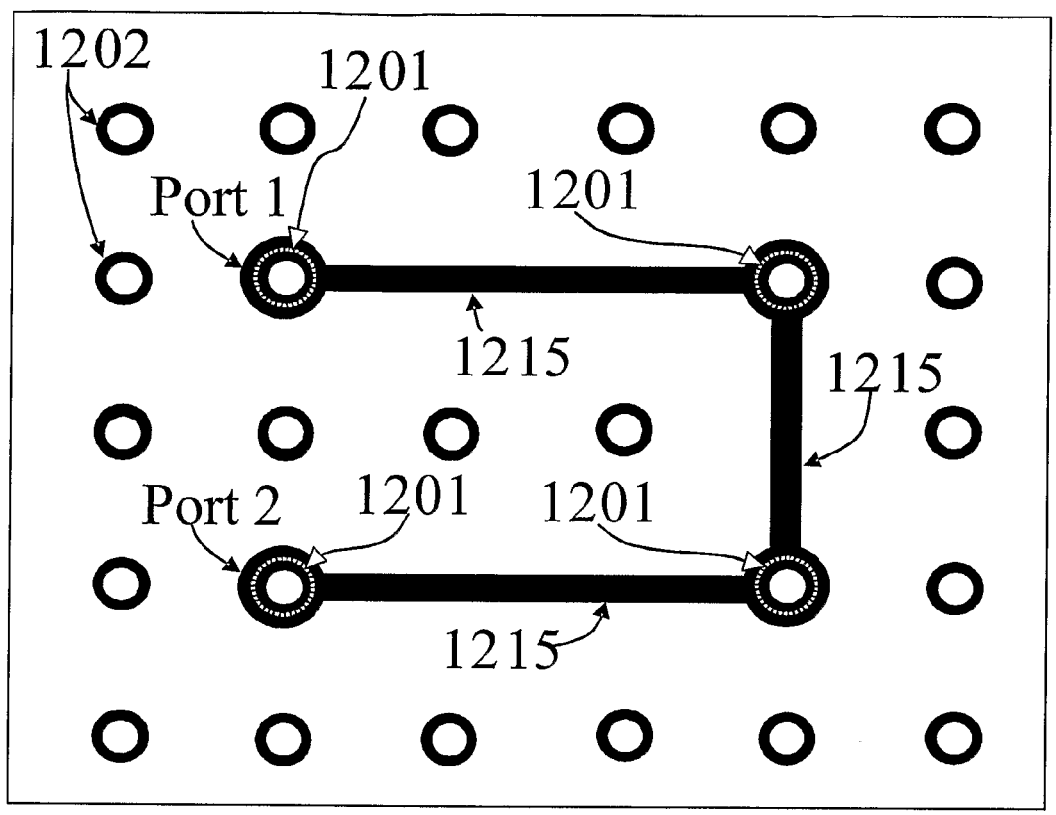
FIG. 12 shows a top view of a filter formed by four composite via structures in a multilayer PCB.

It should be noted that a filter can be provided by a different number of composite via structures in a multilayer PCB which can form short-circuited stubs, or open-circuited stubs, or a composition of short- and open-circuited stubs in the PCB. As an example, a top of view of a filter consisting of four composite via structures is shown in FIG. 12. In considered case, composite via structures consisting of signal via conductors 1201 and assemblies of ground vias 1202 are connected by means of microstrip lines 1215. Two ports of the filter are also shown in the figure.

To show a possibility of the realization of invented composite via structures and filters based on the use of these structures in a multilayer PCB, some results of simulations are presented here. The results include magnitudes of the S-parameters against frequency calculated by the finite-difference time-domain (FDTD) algorithm, which is one of the most accurate numerical methods to characterize three-dimensional structures.

Figure 13:
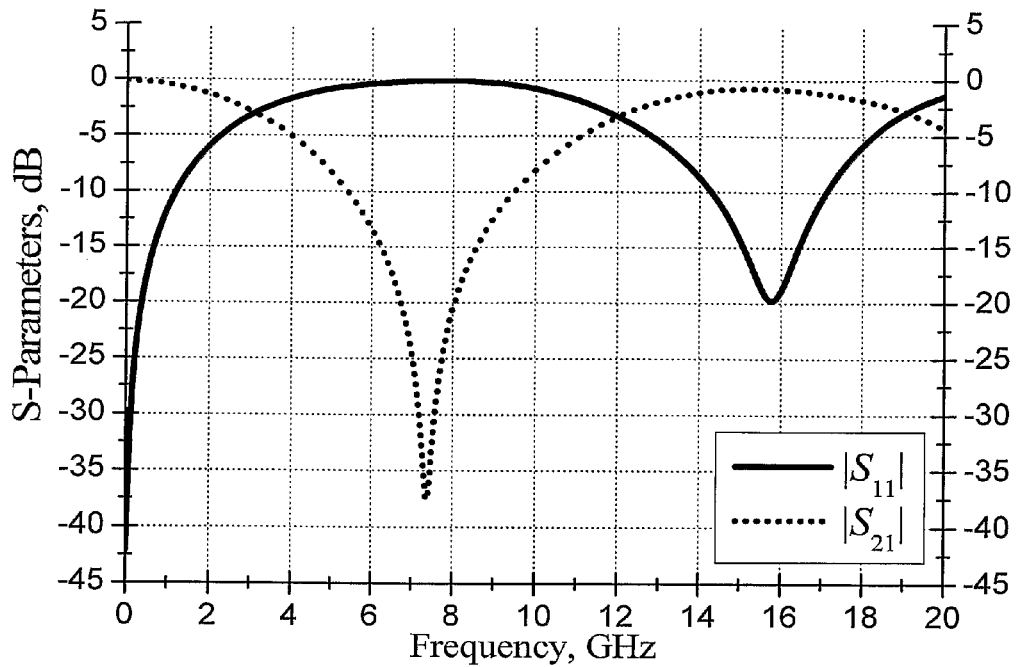
FIG. 13 shows simulation results of magnitudes of S-parameters for a filter formed by a composite via structure providing an open-circuited stub and a stripline in an eight-conductor-layer PCB.

In FIG. 13, magnitudes of S-parameters of a filter consisting of a composite via structure forming an open-circuited stub and a stripline in an 8-conductor layer PCB are shown. Arrangement of ground vias surrounding the signal via conductor has a square form and the geometry of the filter is similar to that shown in FIGS. 5a and 5b. But only the all additional conductive plates connected to the signal via conductor have round shapes with the centers on the axis of the signal via conductor. The radius of these additional plates and also the second pad of the composite via structure is 0.7 mm. The conductive plates are separated from ground plates by isolating slots of the 0.125-mm width. Other dimensions of the filter are as follows: The outer diameter of the signal via conductor and ground vias is 0.3 mm; the distance between the centers of neighboring ground vias in the composite via structure is 1.1 mm; the width of the stripline is 0.12 mm; the diameter of the first and special pads is 0.6 mm; the clearance hole diameter in the first functional part of the composite via structure is 1.65 mm; the thickness of the PCB including all conductor layers is 2.5 mm; the distance between the first pad and special pads in the PCB is 0.435 mm. In simulations a material isolating the conductive layers of the PCB has the relative permittivity of 4.2 and is considered as lossless one. From presented results the high Q-factor bandstop effect is clearly traced at the central frequency about 7.3 GHz. Thus, this example demonstrates a possibility to form a high-performance bandstop filter using a composite via structure of such type.

Figure 14:
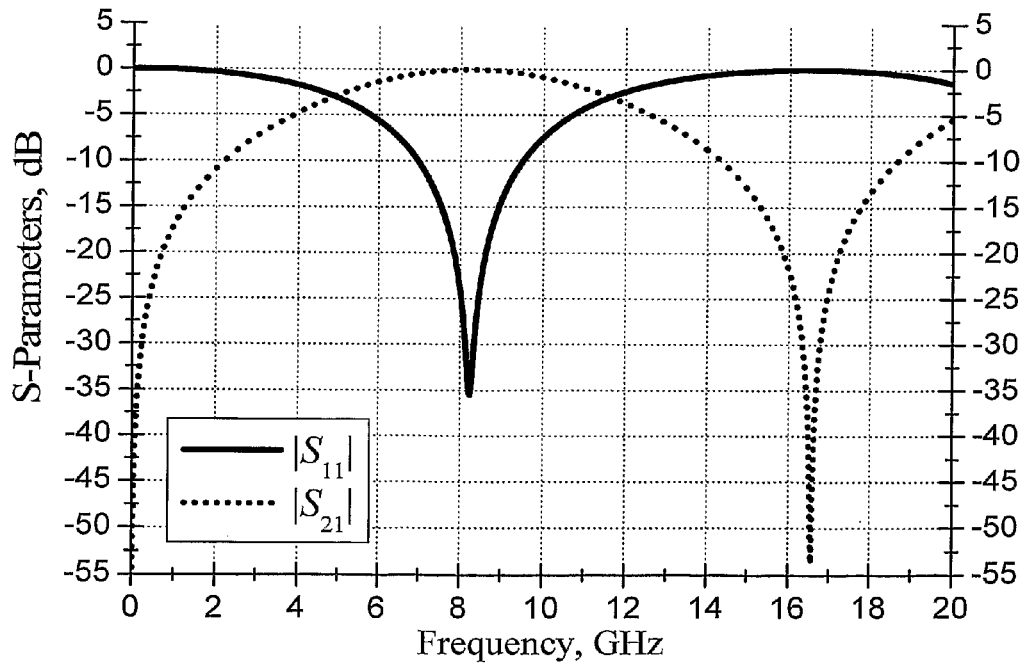
FIG. 14 shows simulation results of magnitudes of S-parameters for a filter formed by a composite via structure providing an short-circuited stub and a stripline in an eight-conductor-layer PCB.

Magnitudes of S-parameters of a filter consisting of a composite via structure forming a short-circuited stub and a stripline in an 8-conductor layer PCB are shown in FIG. 14. The geometry and dimensions of the filter are the same as in FIG. 13, but the second pad of the composite via structure is connected to the ground plane disposed at the eight conductor layer (see FIGS. 6A and 6B). Presented data demonstrate the bandpass effect with the central resonance frequency about 8.2 GHz. Thus, this example of the bandpass filters shows applicability of invented composite via structures to design bandpass filtering components in multilayer PCBs.

Figure 15:
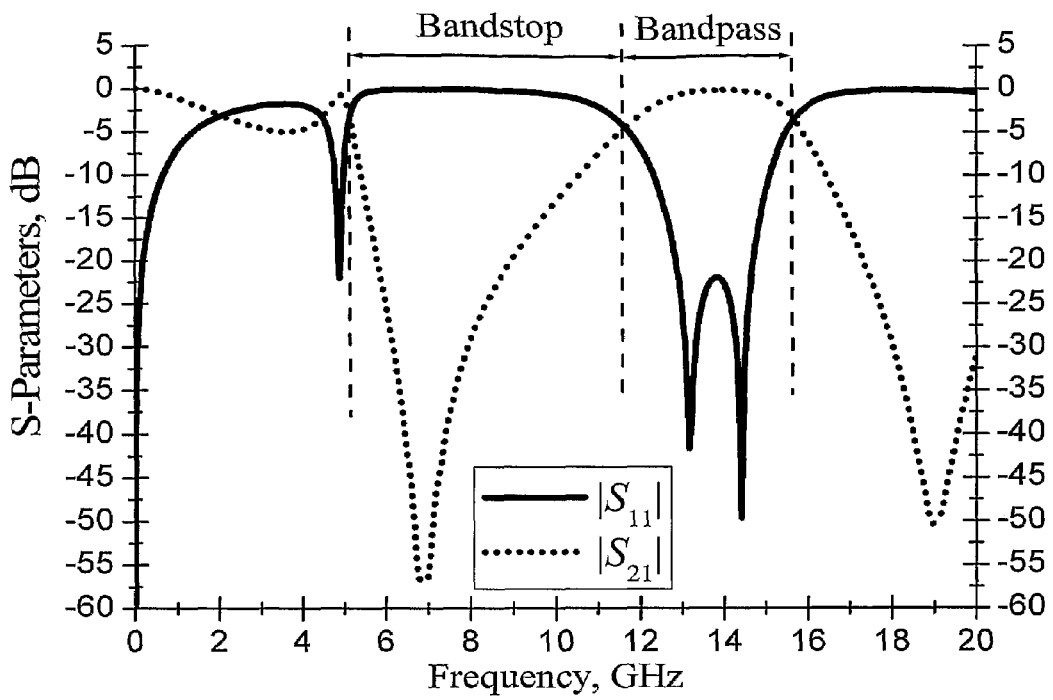
FIG. 15 shows simulation results of magnitudes of S-parameters for a filter formed by two composite via structures connected by means of a stripline providing two open-circuited stubs in an eight-conductor-layer PCB.

In FIG. 15, magnitudes of S-parameters for a filter consisting of two same composite via structures in an 8-conductor layer PCB are shown. Two composite via structures form two open-circuited resonant stubs and are connected by means of a stripline. Dimensions of the composite via structure and the stripline are the same as for FIG. 13 and the distance between the centers of signal via conductors of the composite via structures is 2.2 mm. Two ports of the filter are at the first pads of the composite via structures as shown in FIGS. 9A and 9B. From FIG. 15 one can define clear bandstop and bandpass properties of the filter.

Figure 16:
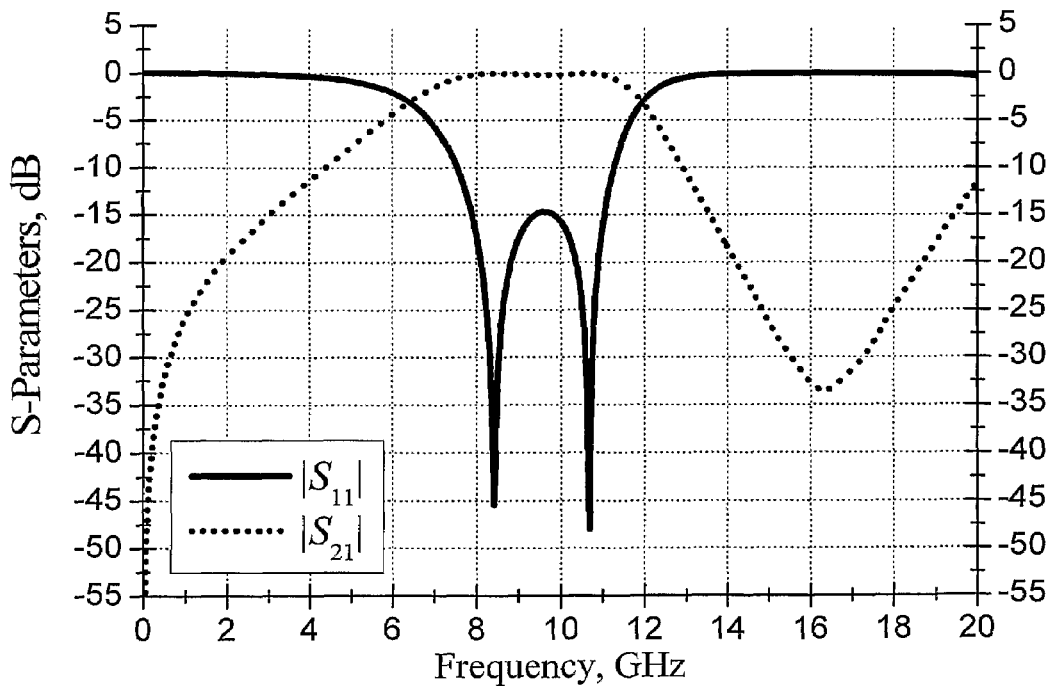
FIG. 16 shows simulation results of magnitudes of S-parameters for a filter formed by two composite via structures connected by means of a stripline providing two short-circuited stubs in an eight-conductor-layer PCB.

FIG. 16 shows magnitudes of S-parameters for a filter consisting also of two same composite via structures in an 8-conductor layer PCB. But in this case two composite via structures have two short-circuited resonant stubs and are connected by means of a stripline. Note that second pads of considered composite via structures are connected to the ground plate at the eight conductor layer of the PCB (see FIGS. 10A and 10B). Dimensions of the composite via structure and the stripline are the same as for FIG. 13 and the distance between the centers of the signal via conductors of the composite via structures is 2.2 mm. Two ports of the filter are at the first pads of the composite via structures as shown in FIGS. 10A and 10B. From FIG. 16 one can define clear bandpass properties of the filter at the frequency band from about 7 GHz to 12 GHz.

Presented examples demonstrate effectiveness and possibilities invented structures to provide different types of filters in multilayer PCBs.

It should be noted that provided filtering structures can be also implemented in System-on-Package, System-in-Package, and System-on-Package-on-Board.

The invention claimed is:

1. A composite via structure in a multilayer printed circuit board (PCB) comprising:
   a first functional part extending in a vertical direction from a first pad disposed at one side of the PCB to a special pad embedded in the PCB for a connection to a planar transmission line, providing a low-return loss and shielded vertical transition between the first pad and the special pad, and including:
      a signal via conductor as a through-plated hole in the PCB with the first pad and special pad being connected to the signal via conductor;
      an assembly of ground vias surrounding the signal via conductor and forming said vertical transition of a predetermined characteristic impedance;
      a clearance hole separating the signal via conductor, first and special pads from grounding conductors of the composite via structure and having predetermined dimensions and shape providing the low return loss of said vertical transition;
   a second functional part providing an open-circuited resonant length extending in the vertical direction from said special pad to the second pad disposed on the opposite side of the PCB, and including:
      the same signal via conductor as the first functional part; and
      the same assembly of ground vias surrounding the signal via conductor as the first functional part; and
      a plurality of conductive plates disposed at the conductor layers of the PCB, connected to the signal via conductor, and separated from grounding conductors by isolating slots,
      wherein said second pad is connected to the signal via conductor and separated from grounding conductors disposed at the same conductor layer by an isolating slot.

2. The composite via structure as defined in claim 1 wherein two assemblies of ground vias are included in the composite via structure and that the first assembly of ground vias is extended in the vertical direction from the one side of the PCB to the conductor plane used in forming a planar transmission line connected to the special pad of the composite via structure and the second assembly of ground vias is extended in the vertical direction from the conductor plane, to which the ends of ground vias of the first assembly are connected, to the conductor layer on the opposite side of the PCB.

3. A filter in a multilayer PCB comprising:
   a planar transmission line in which the first end acts as input/output port of the filter; and
   the composite via structure in the multilayer PCB as defined in claim 2 connected to the second end of said planar transmission line by means of the first pad of the composite via structure,
   wherein said first pad of the composite via structure serves as input/output port of the filter, and
   wherein the conductive plates of the second functional part connected to the signal via conductor and the second pad of the composite via structure have forms and dimensions providing required resonance frequency of an open-circuited stub formed by the composite via structure.

4. A filter in a multilayer PCB comprising:
   a planar transmission line;
   a first composite via structure in the PCB having features as defined by the composite via structure in claim 2 in which the first pad acts as input/output port of the filter and the special pad is connected to the first end of said planar transmission line; and
   a second composite via structure in the PCB having features as defined by the composite via structure in claim 2 in which the first pad acts as input/output port of the filter and the special pad is connected to the second end of said planar transmission line.

5. The composite via structure as defined in claim 1, wherein the first pad is registered to the special pad.

6. A filter in a multilayer PCB comprising:
   a planar transmission line in which the first end acts as input/output port of the filter; and
   the composite via structure in the multilayer PCB as defined in claim 5 connected to the second end of said planar transmission line by means of the first pad of the composite via structure;
   wherein said first pad of the composite via structure serves as input/output port of the filter, and
   wherein the conductive plates of the second functional part connected to the signal via conductor and the second pad of the composite via structure have forms and dimensions providing required resonance frequency of an open-circuited stub formed by the composite via structure.

7. A filter in a multilayer PCB comprising:
   a planar transmission line;
   a first composite via structure in the PCB having features as defined by the composite via structure in claim 5 in which the first pad acts as input/output port of the filter and is connected to the first end of said planar transmission line; and
   a second composite via structure in the PCB having features as defined by the composite via structure in claim 5 in which the first pad acts as input/output port of the filter and is connected to the second end of said planar transmission line.

8. A filter in a multilayer PCB comprising:
   a planar transmission line;
   a first composite via structure in the PCB having features as defined by the composite via structure in claim 5 in which the first pad acts as input/output port of the filter and is connected to a first end of said planar transmission line; and
   a second composite via structure in the PCB having features as defined by the composite via structure in claim 5 in which the first pad of the second composite via structure acts as input/output port of the filter and is connected to a second end of said planar transmission line, wherein the first pad of the first composite via structure is registered to the special pad of the second composite via structure.

9. A filter in a multilayer PCB comprising:
   a planar transmission line in which the first end acts as input/output port of the filter; and
   the composite via structure in the multi layer PCB as defined in claim 1 connected to the second end of said planar transmission line by the special pad of the composite via structure;
   wherein said first pad of the composite via structure serves as input/output port of the filter, and
   wherein the conductive plates of the second functional part connected to the signal via conductor and the second pad of the composite via structure have forms and dimensions providing required resonance frequency of an open-circuited stub formed by the composite via structure.

10. A filter in a multilayer PCB comprising:
a planar transmission line;
a first composite via structure in the PCB having features as defined by the composite via structure in claim 1 in which the first pad acts as input/output port of the filter and the special pad is connected to the first end of said planar transmission line; and
a second composite via structure in the PCB having features as defined by the composite via structure in claim 1 in which the first pad acts as input/output port of the filter and the special pad is connected to the second end of said planar transmission line.

11. A filter in a multilayer PCB comprising:
a planar transmission line;
a first composite via structure in the PCB having features as defined by the composite via structure in claim 1 in which the first pad acts as input/output port of the filter and the special pad is connected to a first end of said planar transmission line;
a second composite via structure comprising:
a first functional part extending in the vertical direction from the first pad disposed at the one side of the PCB to the special pad embedded in the PCB for a connection to the planar transmission line, providing a low-return loss and shielded vertical transition between the first pad and the special pad, and including:
 a signal via conductor as a through-plated hole in the PCB with a first pad and a special pad being connected to the signal via conductor;
 an assembly of ground vias surrounding the signal via conductor wherein said first pad acts as an input/output port of the filter and said special pad is further connected to a second end of said planar transmission line and forming said vertical transition of the predetermined characteristic impedance;
a clearance hole separating the signal via conductor, first and special pads from grounding conductors of the composite via structure and having predetermined dimensions and shape providing the low return losses of said vertical transition;
second functional part providing a short-circuited resonant length extending in the vertical direction from said other special pad to a second pad of the composite via structure disposed on the opposite side of the PCB, and including:
 the same type of signal via conductor as the first functional part; and
 the same type of assembly of ground vias surrounding the signal via conductor as the first functional part; and
a plurality of conductive plates disposed at the conductor layers of the PCB, connected to the signal via conductor and separated from grounding conductors by isolating slots,
wherein said second pad is connected to both the signal via conductor and grounding conductors disposed at the same side of the PCB.

12. A filter in a multilayer PCB comprising:
a planar transmission line;
a plurality of composite via structures having features as defined by the composite via structure in claim 1 connected by said planar transmission line, and the first pads of composite via structures having only one connection to said planar transmission line acts as input/output ports of the filter.

13. A composite via structure in a multilayer printed circuit board (PCB) comprising:
a first functional part extending in a vertical direction from a first pad disposed at one side of the PCB to a special pad embedded in the PCB for a connection to a planar transmission line, providing a low-return loss and shielded vertical transition between the first pad and the special pad, and including:
 a signal via conductor as a through-plated hole in the PCB with the first pad and special pad being connected to the signal via conductor;
an assembly of ground vias surrounding the signal via conductor and forming said vertical transition of a predetermined characteristic impedance;
a clearance hole separating the signal via conductor, first and special pads from grounding conductors of the composite via structure and having predetermined dimensions and shape providing the low return loss of said vertical transition;
a second functional part providing a short-circuited resonant length extending in the vertical direction from said special pad to the second pad of the composite via structure disposed on the opposite side of PCB and including:
 the same type of signal via conductor as the first functional part; and
 the same type of assembly of ground vias surrounding the signal via conductor as the first functional part; and
a plurality of conductive plates disposed at the conductor layers of the PCB, connected to the signal via conductor and separated from grounding conductors by isolating slots,
wherein said second pad is connected to both the signal via conductor and grounding conductors disposed at the same side of the PCB.

14. The composite via structure as defined in claim 13, wherein two assemblies of ground vias are included in the composite via structure at that the first assembly of ground vias is extended in the vertical direction from the one side of the PCB to the conductor plane used in forming a planar transmission line connected to the special pad of the composite via structure and the second assembly of ground vias is extended in the vertical direction from the conductor plane, to which the ends of ground vias of the first assembly are connected, to the conductor layer on the opposite side of the PCB.

15. A filter in a multilayer PCB comprising:
a planar transmission line in which the first end acts as input/output port of the filter; and
the composite via structure in the multilayer PCB as defined in claim 14 connected to the second end of said planar transmission line by means of the first pad of the composite via structure,
wherein said first pad of the composite via structure serves as input/output port of the filter, and
wherein the conductive plates of the second functional part connected to the signal via conductor have forms and dimensions providing required resonance frequency of a short-circuited stub formed by the composite via structure.

16. The composite via structure as defined in claim 13, wherein the first pad is registered to the special pad.

17. A filter in a multilayer PCB comprising:
a planar transmission line in which the first end acts as input/output port of the filter;

the composite via structure in the multilayer PCB as defined in claim 16 connected to the second end of said planar transmission line by means of the first pad of the composite via structure;

wherein said first pad of the composite via structure serves as input/output port of the filter, and wherein the conductive plates of the second functional part connected to the signal via conductor of the composite via structure have forms and dimensions providing required resonance frequency of a short-circuited stub formed by the composite via structure.

18. A filter in a multilayer PCB comprising:

a planar transmission line;

a first composite via structure in the PCB having features as defined by the composite via structure in claim 16 in which the first pad acts as input/output port of the filter and is connected to the first end of said planar transmission line; and a second composite via structure in the PCB having features as defined by the composite via structure in claim 16 in which the first pad acts as input/output port of the filter and is connected to the second end of said planar transmission line.

19. A filter in a multilayer PCB comprising:

a planar transmission line in which the first end acts as input/output port of the filter;

the composite via structure in the multilayer PCB as defined in claim 13 connected to the second end of said planar transmission line by the special pad of the composite via structure;

wherein said first pad of the composite via structure serves as input/output port of the filter, and wherein the conductive plates of the second functional part connected to the signal via conductor have forms and dimensions providing required resonance frequency of a short-circuited stub formed by the composite via structure.

20. A filter in a multilayer PCB comprising:

a planar transmission line;

a first composite via structure in the PCB having features as defined by the composite via structure in claim 13 in which the first pad acts as input/output port of the filter and the special pad is connected to the first end of said planar transmission line; and a second composite via structure in the PCB having features as defined by the composite via structure in claim 13 in which the first pad acts as input/output port of the filter and the special pad is connected to second end of said planar transmission line.

* * * * *